United States Patent
Jeon et al.

(10) Patent No.: US 12,148,862 B2
(45) Date of Patent: Nov. 19, 2024

(54) DISPLAY APPARATUS USING MICRO LED AND MANUFACTURING METHOD THEREFOR

(71) Applicant: LG ELECTRONICS INC., Seoul (KR)

(72) Inventors: Jina Jeon, Seoul (KR); Yongdae Kim, Seoul (KR); Myoungsoo Kim, Seoul (KR); Yoonchul Kim, Seoul (KR); Jungsub Kim, Seoul (KR); Sunghyun Moon, Seoul (KR); Yeonhong Jung, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 420 days.

(21) Appl. No.: 17/763,050

(22) PCT Filed: Sep. 25, 2019

(86) PCT No.: PCT/KR2019/012438
§ 371 (c)(1),
(2) Date: Mar. 23, 2022

(87) PCT Pub. No.: WO2021/060577
PCT Pub. Date: Apr. 1, 2021

(65) Prior Publication Data
US 2022/0416125 A1 Dec. 29, 2022

(30) Foreign Application Priority Data
Sep. 24, 2019 (KR) .................. 10-2019-0117594

(51) Int. Cl.
*H01L 33/38* (2010.01)
*H01L 25/075* (2006.01)
(Continued)

(52) U.S. Cl.
CPC ........ *H01L 33/382* (2013.01); *H01L 25/0753* (2013.01); *H01L 33/0093* (2020.05); *H01L 33/62* (2013.01)

(58) Field of Classification Search
CPC .............. H01L 33/382; H01L 25/0753; H01L 33/0093; H01L 33/62; H01L 33/0095;
(Continued)

(56) References Cited

U.S. PATENT DOCUMENTS 10,186,549 B1 * 1/2019 Cheung .................. H01L 24/81
2010/0123268 A1 5/2010 Menard
(Continued)

FOREIGN PATENT DOCUMENTS

EP 4 020 567 A1 6/2022
KR 10-2018-0051006 A 5/2018
(Continued)

OTHER PUBLICATIONS

Machine translation of KR 2019 0104277 (Year: 2019).*

*Primary Examiner* — J. E. Schoenholtz
(74) *Attorney, Agent, or Firm* — Birch, Stewart, Kolasch & Birch, LLP

(57) ABSTRACT

Discussed is a manufacturing method of a display apparatus, and the display apparatus. The display includes a substrate, an adhesive layer located on the substrate and including protruding portions, semiconductor light-emitting diodes located on the adhesive layer, an insulating layer located on the semiconductor light-emitting diodes and the adhesive layer, and wiring electrodes electrically connected to the semiconductor light-emitting diodes, wherein the protruding portions of the adhesive layer are positioned at regular intervals to correspond to the shapes of the contact surfaces of the semiconductor light-emitting diodes in contact with the adhesive layer.

20 Claims, 29 Drawing Sheets

(51) Int. Cl.
  *H01L 33/00*  (2010.01)
  *H01L 33/62*  (2010.01)
(58) Field of Classification Search
  CPC ... H01L 27/156; H01L 21/28; H01L 33/0045;
  H01L 2224/0344
  See application file for complete search history.

(56) References Cited

U.S. PATENT DOCUMENTS

2016/0155720 A1    6/2016  Wickramanayaka
2021/0210667 A1*  7/2021  Brodoceanu ............ H01L 24/95

FOREIGN PATENT DOCUMENTS

| KR | 10-2019-0077254 A | | 7/2019 | |
|---|---|---|---|---|
| KR | 10-2019-0098329 A | | 8/2019 | |
| KR | 10-2019-0104277 A | | 9/2019 | |
| KR | 20190104277 | * | 9/2019 | ............ H01L 27/15 |

* cited by examiner (a)

(b)

(c)

(a)  (b)

(c)  (d)

(a)                    (b)

(a)

(b)

(c)

(a)

(b)

(a)

(b)

(c)

(a)

(b)

(a)                                (b)

DISPLAY APPARATUS USING MICRO LED AND MANUFACTURING METHOD THEREFOR

CROSS REFERENCE TO RELATED APPLICATIONS

This application is the National Stage filing under 35 U.S.C. 371 of International Application No. PCT/KR2019/012438, filed on Sep. 25, 2019, which claims the benefit of earlier filing date and right of priority to Korean Application No. 10-2019-0117594, filed on Sep. 24, 2019, the contents of all these applications are hereby incorporated by reference herein in their entirety.

TECHNICAL FIELD

The present disclosure relates to technology related to a display device, and more particularly to a method for manufacturing a display device using a micro-light emitting diode (micro-LED) and a substrate used in manufacturing the display device.

BACKGROUND ART

Recently, in a field of a display technology, display devices having excellent characteristics such as thinness, flexibility, and the like have been developed. On the other hand, currently commercialized major displays are represented by a LCD (liquid crystal display) and an OLED (organic light emitting diode).

However, the LCD has a response time that is not fast, and is difficult to be flexibly implemented.

On the other hand, LED (light emitting diode), which is a well-known semiconductor light-emitting element that converts electric current into light, has been used as a light source for a display image of an electronic device including an information and communication device along with a GaP:N-based green LED, starting with commercialization of a red LED using a GaAsP compound semiconductor in 1962. Accordingly, a method for solving the above-described problems by implementing a display using the semiconductor light-emitting element may be proposed. Such light emitting diode has various advantages, such as long lifespan, low power consumption, excellent initial driving characteristics, high vibration resistance, and the like, compared to a filament-based light-emitting element.

In order to implement a display device using the above semiconductor light emitting elements, a large number of semiconductor light emitting elements are necessary. Further, in order to implement a display device having a large area, semiconductor light emitting elements formed on a growth substrate need to be individually separated therefrom and transferred or assembled to a display panel having a large area.

In addition, in the transfer or assembly process, the semiconductor light emitting elements need to be accurately disposed at desired positions so that a subsequent wiring process is smoothly performed.

Therefore, the present disclosure proposes a method of simultaneously transferring a large number of semiconductor light emitting elements while minimizing arrangement error, and a display device using the same.

DISCLOSURE

Technical Task

An object of an embodiment of the present disclosure is to provide a display device using a semiconductor light emitting element and a method of manufacturing the same.

Another object of an embodiment of the present disclosure is to provide a manufacturing method of minimizing arrangement error of semiconductor light emitting elements in a process of transferring the semiconductor light emitting elements, and a display device using the same.

Further, another object of the present disclosure is to solve various problems not mentioned herein. Those skilled in the art will appreciate the embodiments of the present disclosure through the description and drawings to be described later.

Technical Solutions

In order to accomplish the above objects, a method of manufacturing a display device using a semiconductor light emitting element includes aligning a second substrate for transfer so as to face a first substrate provided thereon with a semiconductor light emitting element, provisionally pressing the semiconductor light emitting element on the first substrate onto the second substrate, finally pressing the semiconductor light emitting element on the first substrate onto the second substrate using pressure applied to the second substrate, which is generated according to a change in pneumatic pressure, and transferring the semiconductor light emitting element on the first substrate to the second substrate by removing the first substrate.

According to an embodiment, the method may further include aligning a third substrate so as to face the second substrate, provisionally pressing a semiconductor light emitting element on the second substrate onto the third substrate, finally pressing the semiconductor light emitting element on the first substrate onto the third substrate using pressure applied to the second substrate, which is generated according to a change in pneumatic pressure, and transferring the semiconductor light emitting element on the second substrate to the third substrate by removing the second substrate.

According to an embodiment, the finally pressing may include performing at least one of vacuum pressing or high-pressure pressing.

According to an embodiment, the first substrate may be a growth substrate configured to allow the semiconductor light emitting element to be formed thereon or an assembly substrate configured to allow the semiconductor light emitting element to be assembled thereto.

According to an embodiment, the third substrate may be a wiring substrate provided with a transistor to drive an active matrix.

According to an embodiment, the second substrate may include an organic stamp layer, which is adhesive.

According to an embodiment, the third substrate may include an adhesive layer formed on a surface thereof to which the semiconductor light emitting element is transferred.

According to an embodiment, the organic stamp layer may have first adhesive force lower than the second adhesive force of the adhesive layer.

According to an embodiment, the organic stamp layer may be made of a flexible material that is deformable according to pressure applied to the organic stamp layer.

According to an embodiment, in the finally pressing the semiconductor light emitting element onto the third substrate, an indentation may be formed in the adhesive layer so as to correspond to a transfer surface of the semiconductor light emitting element transferred to the third substrate.

According to an embodiment, the indentation may be formed in a contact region of the adhesive layer, which comes into contact with a portion of the organic stamp layer due to deformation of the organic stamp layer.

According to an embodiment, the indentation may include an elevated portion formed on a periphery of the contact region.

According to an embodiment, the elevated portion may have a height formed in proportion to the intensity of pressure applied to the organic stamp layer.

According to an embodiment, in the finally pressing, the vacuum pressing may be performed to make the pneumatic pressure at the front surface of the second substrate, which is provided with the semiconductor light emitting element transferred thereto, lower than the pneumatic pressure at the rear surface of the second substrate.

According to an embodiment, the high-pressure pressing may be performed to spray a gas having pressure exceeding atmospheric pressure in all directions toward the provisionally pressed semiconductor light emitting element and the second substrate.

A display device using a semiconductor light emitting element according to another embodiment of the present disclosure includes a substrate, an adhesive layer located on the substrate and including an elevated portion, a semiconductor light emitting element located on the adhesive layer, an insulating layer located on the semiconductor light emitting element and the adhesive layer, and a wiring electrode electrically connected to the semiconductor light emitting element. The elevated portion of the adhesive layer is formed so as to correspond to the shape of a contact surface of the semiconductor light emitting element, which is in contact with the adhesive layer, and is spaced a predetermined interval apart from the semiconductor light emitting element.

According to an embodiment, the elevated portion may be continuously formed on the adhesive layer in the shape of a closed curve.

According to an embodiment, the semiconductor light emitting element may be located inside the closed curve.

Advantageous Effects

According to an embodiment of the present disclosure, a display device using a semiconductor light emitting element and a method of manufacturing the same may be provided.

Specifically, vacuum pressing or high-pressure pressing is performed on a semiconductor light emitting element using a transfer substrate including a flexible adhesive material, thereby transferring the semiconductor light emitting element from a growth substrate (or an assembly substrate) to the transfer substrate or from the transfer substrate to a wiring substrate while minimizing arrangement error.

Further, the size of the transfer substrate may be increased by reducing the arrangement error. Accordingly, when semiconductor light emitting elements are transferred to a wiring substrate having a large area, the number of transfer operations may be reduced, and thus the time required to manufacture a display device may be shortened.

Further, according to another embodiment of the present disclosure, there are additional technical effects not mentioned here. Those skilled in the art can understand the present disclosure through the purposes of the specification and drawings.

BEST MODE FOR DISCLOSURE

Reference will now be made in detail to embodiments of the present disclosure, examples of which are illustrated in the accompanying drawings. Wherever possible, the same reference numbers will be used throughout the drawings to refer to the same or like parts, and redundant description thereof will be omitted. As used herein, the suffixes "module" and "unit" are added or used interchangeably to facilitate preparation of this specification and are not intended to suggest distinct meanings or functions. In describing embodiments disclosed in this specification, relevant well-known technologies may not be described in detail in order not to obscure the subject matter of the embodiments disclosed in this specification. In addition, it should be noted that the accompanying drawings are only for easy understanding of the embodiments disclosed in the present specification, and should not be construed as limiting the technical spirit disclosed in the present specification.

Furthermore, although the drawings are separately described for simplicity, embodiments implemented by combining at least two or more drawings are also within the scope of the present disclosure.

In addition, when an element such as a layer, region or module is described as being "on" another element, it is to be understood that the element may be directly on the other element or there may be an intermediate element between them.

The display device described herein is a concept including all display devices that display information with a unit pixel or a set of unit pixels. Therefore, the display device may be applied not only to finished products but also to parts. For example, a panel corresponding to a part of a digital TV also independently corresponds to the display device in the present specification. The finished products include a mobile phone, a smartphone, a laptop, a digital broadcasting terminal, a personal digital assistant (PDA), a portable multimedia player (PMP), a navigation system, a slate PC, a tablet, an Ultrabook, a digital TV, a desktop computer, and the like.

However, it will be readily apparent to those skilled in the art that the configuration according to the embodiments described herein is applicable even to a new product that will be developed later as a display device.

In addition, the semiconductor light emitting element mentioned in this specification is a concept including an LED, a micro LED, and the like, and may be used interchangeably therewith.

Figure 1:
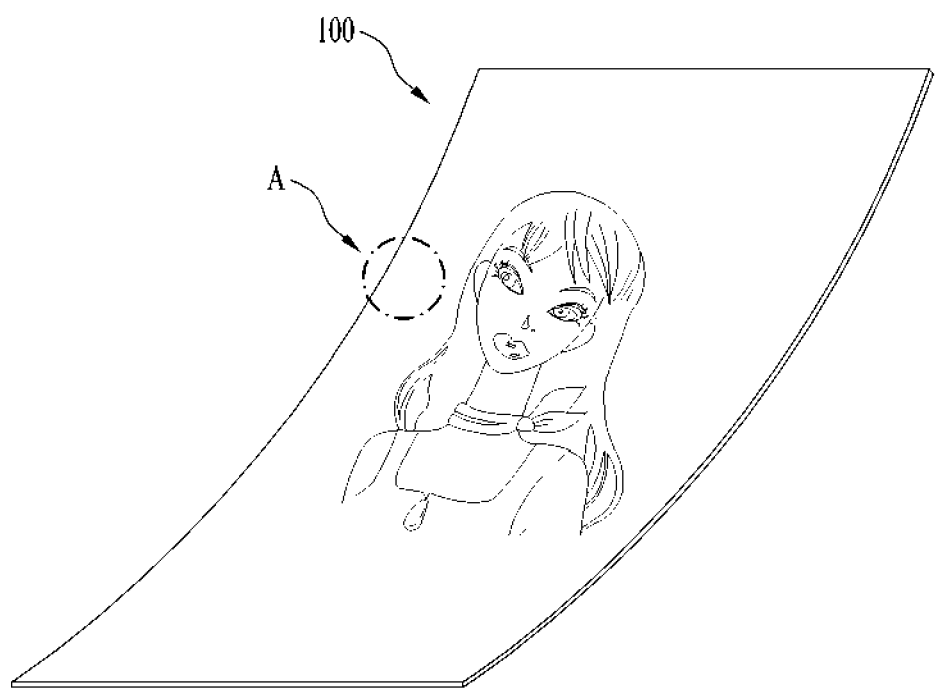
FIG. 1 is a conceptual diagram illustrating an embodiment of a display device using a semiconductor light emitting element according to the present disclosure.

FIG. 1 is a conceptual view illustrating an embodiment of a display device using a semiconductor light emitting element according to the present disclosure.

As shown in FIG. 1, information processed by a controller (not shown) of a display device 100 may be displayed using a flexible display.

The flexible display may include, for example, a display that can be warped, bent, twisted, folded, or rolled by external force.

Furthermore, the flexible display may be, for example, a display manufactured on a thin and flexible substrate that can be warped, bent, folded, or rolled like paper while maintaining the display characteristics of a conventional flat panel display.

When the flexible display remains in an unbent state (e.g., a state having an infinite radius of curvature) (hereinafter referred to as a first state), the display area of the flexible display forms a flat surface. When the display in the first state is changed to a bent state (e.g., a state having a finite radius of curvature) (hereinafter referred to as a second state) by external force, the display area may be a curved surface. As shown in FIG. 1, the information displayed in the second state may be visual information output on a curved surface. Such visual information may be implemented by independently controlling the light emission of sub-pixels arranged in a matrix form. The unit pixel may mean, for example, a minimum unit for implementing one color.

The unit pixel of the flexible display may be implemented by a semiconductor light emitting element. In the present disclosure, a light emitting diode (LED) is exemplified as a type of the semiconductor light emitting element configured to convert electric current into light. The LED may be formed in a small size, and may thus serve as a unit pixel even in the second state.

Hereinafter, a flexible display implemented using the LED will be described in more detail with reference to the drawings.

Figure 2:
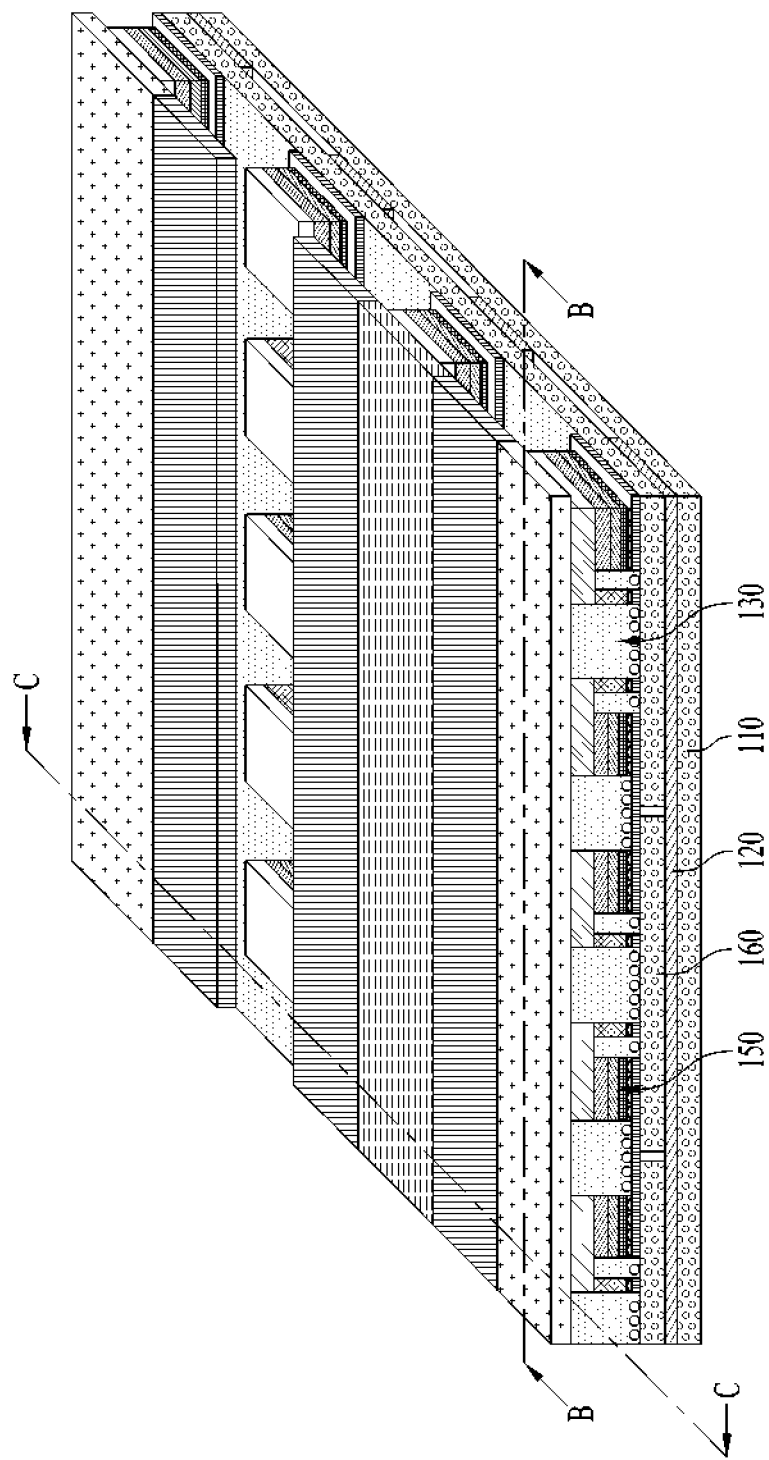
FIG. 2 is a partially enlarged diagram showing a part A shown in FIG. 1.

FIG. 2 is a partially enlarged view showing part A of FIG. 1.

Figure 3A:
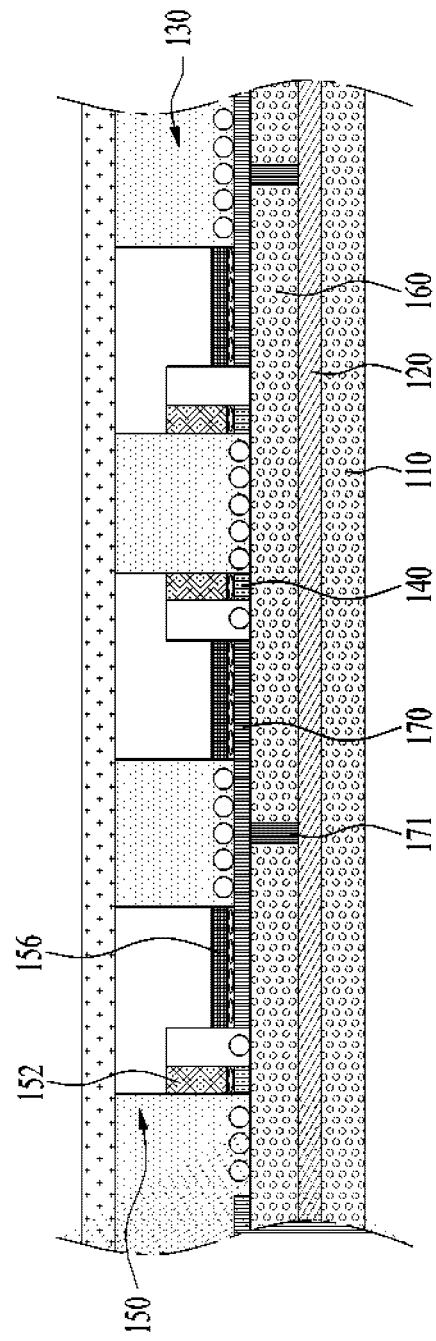
FIGS. 3A and 3B are cross-sectional diagrams taken along the cutting lines B-B and C-C in FIG. 2.
Figure 3B:
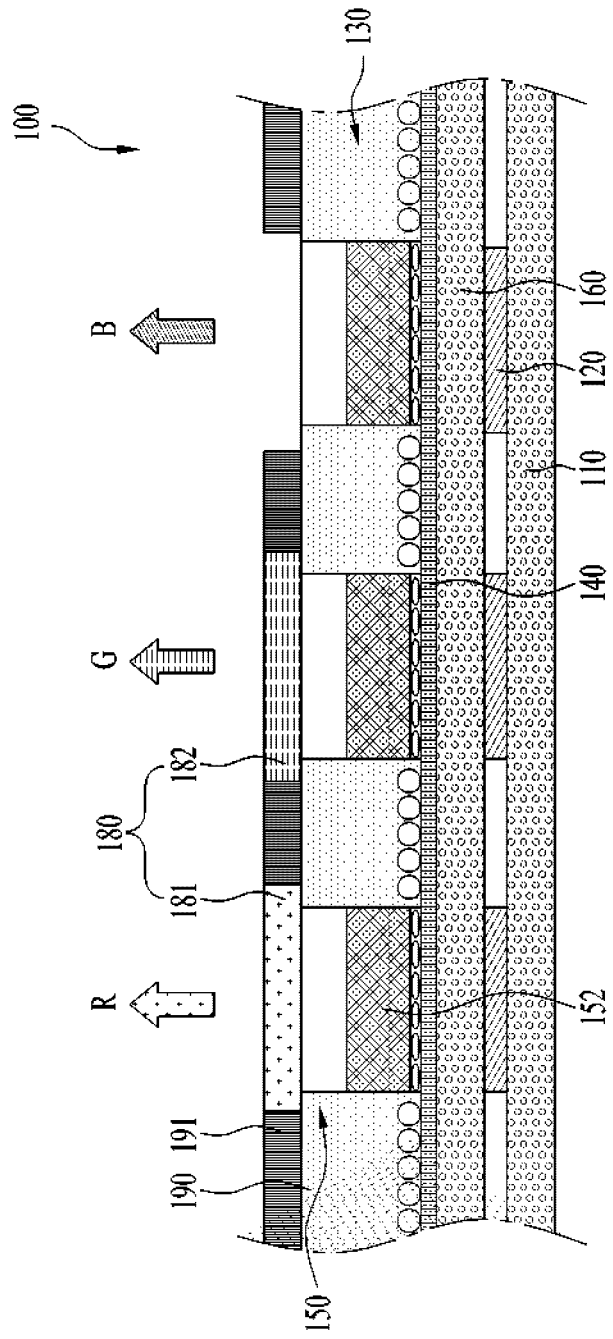

FIGS. 3A and 3B are cross-sectional views taken along lines B-B and C-C in FIG. 2.

Figure 4:
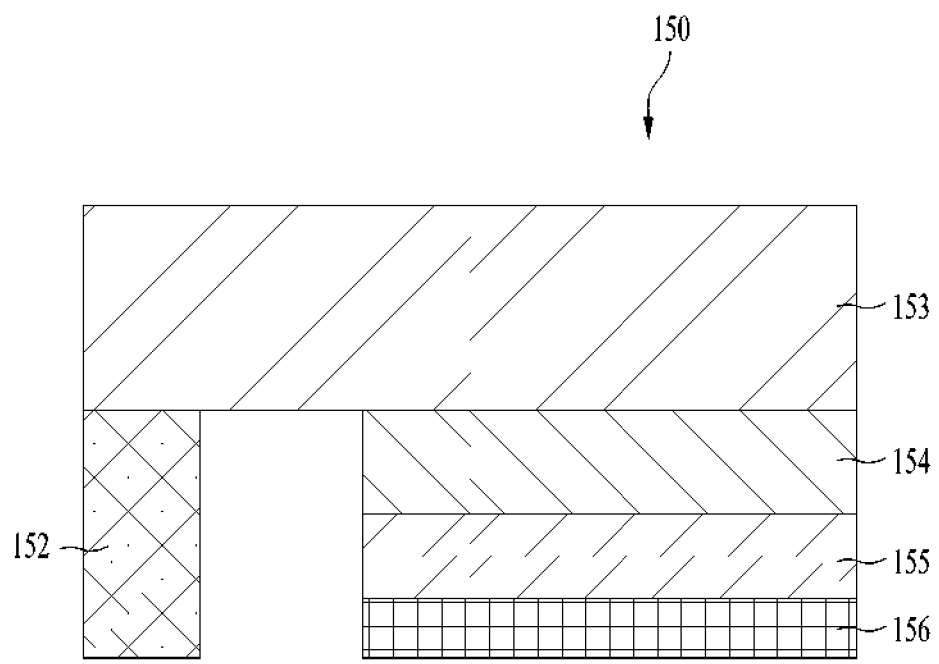
FIG. 4 is a conceptual diagram illustrating the flip-chip type semiconductor light emitting element of FIG. 3.

FIG. 4 is a conceptual view illustrating the flip-chip type semiconductor light emitting element of FIG. 3.

Figure 5A:
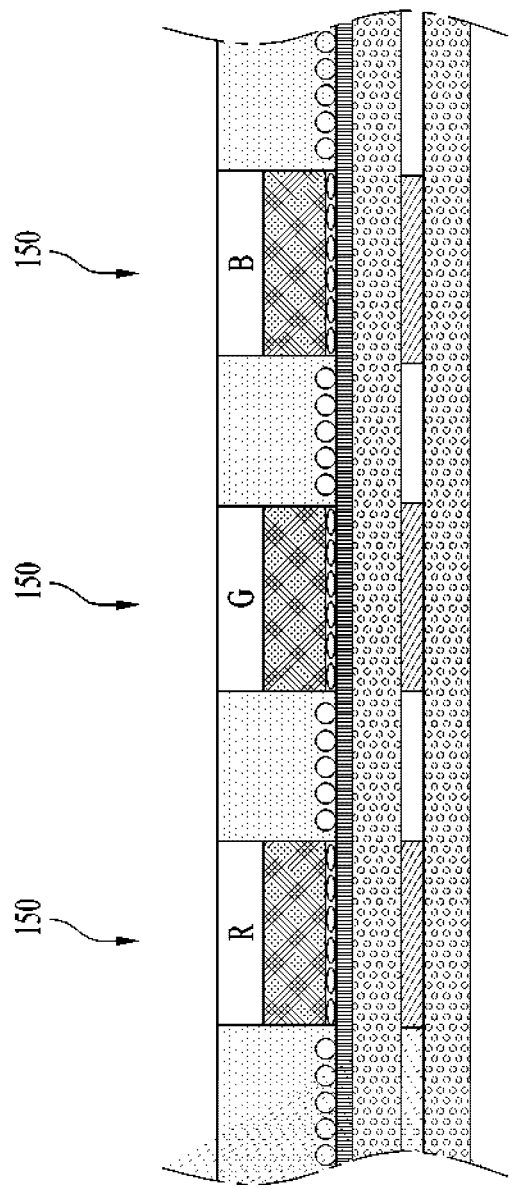
FIGS. 5A to 5C are conceptual diagrams illustrating various examples of color implementation with respect to a flip-chip type semiconductor light emitting element.
Figure 5B:
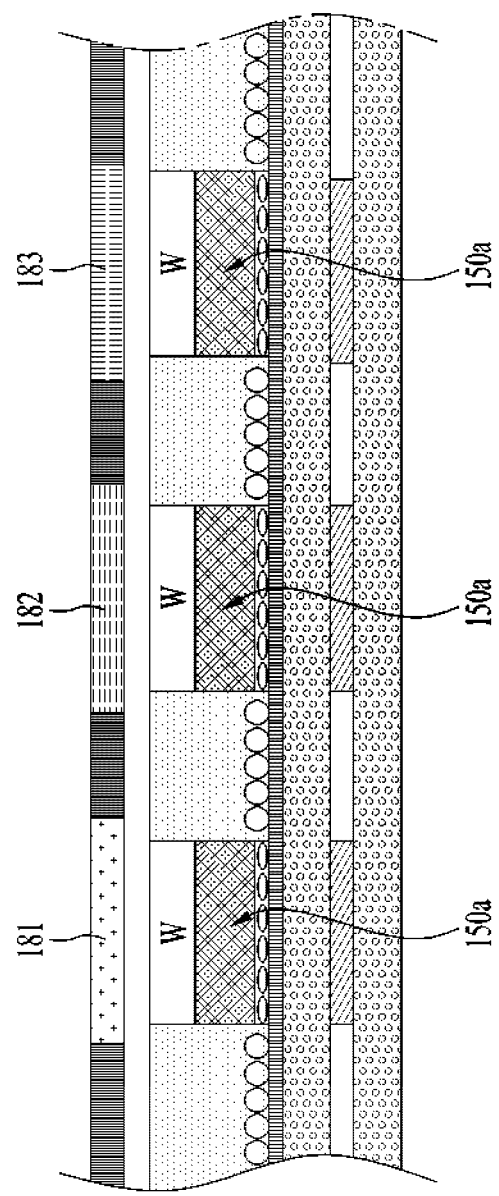
Figure 5C:
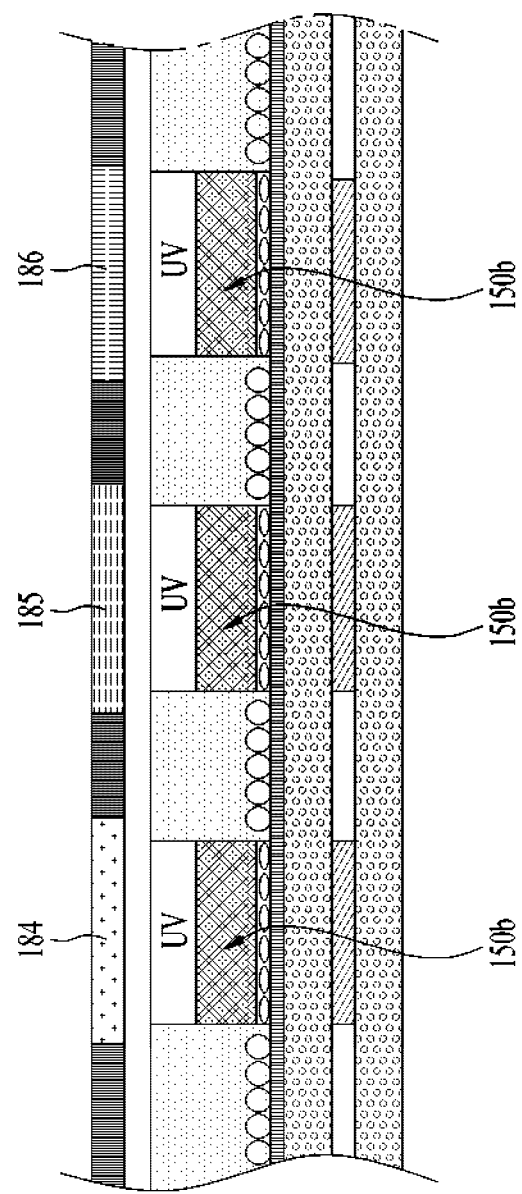

FIGS. 5A to 5C are conceptual views illustrating various examples of implementation of colors in relation to a flip-chip type semiconductor light emitting element.

As shown in FIGS. 2, 3A and 3B, the display device 100 using a passive matrix (PM) type semiconductor light emitting element is exemplified as the display device 100 using a semiconductor light emitting element. However, the examples described below are also applicable to an active matrix (AM) type semiconductor light emitting element.

The display device 100 shown in FIG. 1 may include a substrate 110, a first electrode 120, a conductive adhesive layer 130, a second electrode 140, and at least one semiconductor light emitting element 150, as shown in FIG. 2.

The substrate 110 may be a flexible substrate. For example, to implement a flexible display device, the substrate 110 may include glass or polyimide (PI). Any insulative and flexible material such as polyethylene naphthalate (PEN) or polyethylene terephthalate (PET) may be employed. In addition, the substrate 110 may be formed of either a transparent material or an opaque material.

The substrate 110 may be a wiring substrate on which the first electrode 120 is disposed. Thus, the first electrode 120 may be positioned on the substrate 110.

As shown in FIG. 3A, an insulating layer 160 may be disposed on the substrate 110 on which the first electrode 120 is positioned, and an auxiliary electrode 170 may be positioned on the insulating layer 160. In this case, a stack in which the insulating layer 160 is laminated on the substrate 110 may be a single wiring substrate. More specifically, the insulating layer 160 may be formed of an insulative and flexible material such as PI, PET, or PEN, and may be integrated with the substrate 110 to form a single substrate.

The auxiliary electrode 170, which is an electrode that electrically connects the first electrode 120 and the semiconductor light emitting element 150, is positioned on the insulating layer 160, and is disposed to correspond to the position of the first electrode 120. For example, the auxiliary electrode 170 may have a dot shape and may be electrically connected to the first electrode 120 by an electrode hole 171 formed through the insulating layer 160. The electrode hole 171 may be formed by filling a via hole with a conductive material.

As shown in FIG. 2 or 3A, a conductive adhesive layer 130 may be formed on one surface of the insulating layer 160, but embodiments of the present disclosure are not limited thereto. For example, a layer performing a specific function may be formed between the insulating layer 160 and the conductive adhesive layer 130, or the conductive adhesive layer 130 may be disposed on the substrate 110 without the insulating layer 160. In a structure in which the conductive adhesive layer 130 is disposed on the substrate 110, the conductive adhesive layer 130 may serve as an insulating layer.

The conductive adhesive layer 130 may be a layer having adhesiveness and conductivity. For this purpose, a material having conductivity and a material having adhesiveness may be mixed in the conductive adhesive layer 130. In addition, the conductive adhesive layer 130 may have ductility, thereby providing making the display device flexible.

As an example, the conductive adhesive layer 130 may be an anisotropic conductive film (ACF), an anisotropic conductive paste, a solution containing conductive particles, or the like. The conductive adhesive layer 130 may be configured as a layer that allows electrical interconnection in the direction of the Z-axis extending through the thickness, but is electrically insulative in the horizontal X-Y direction. Accordingly, the conductive adhesive layer 130 may be referred to as a Z-axis conductive layer (hereinafter, referred to simply as a "conductive adhesive layer").

The ACF is a film in which an anisotropic conductive medium is mixed with an insulating base member. When the ACF is subjected to heat and pressure, only a specific portion thereof becomes conductive by the anisotropic conductive medium. Hereinafter, it will be described that heat and pressure are applied to the ACF. However, another method may be used to make the ACF partially conductive. The other method may be, for example, application of only one of the heat and pressure or UV curing.

In addition, the anisotropic conductive medium may be, for example, conductive balls or conductive particles. For example, the ACF may be a film in which conductive balls are mixed with an insulating base member. Thus, when heat and pressure are applied to the ACF, only a specific portion of the ACF is allowed to be conductive by the conductive balls. The ACF may contain a plurality of particles formed by coating the core of a conductive material with an insulating film made of a polymer material. In this case, as the insulating film is destroyed in a portion to which heat and pressure are applied, the portion is made to be conductive by the core. At this time, the cores may be deformed to form layers that contact each other in the thickness direction of the film. As a more specific example, heat and pressure are applied to the whole ACF, and an electrical connection in the Z-axis direction is partially formed by the height difference of a counterpart adhered by the ACF.

As another example, the ACF may contain a plurality of particles formed by coating an insulating core with a conductive material. In this case, as the conductive material is deformed (pressed) in a portion to which heat and pressure are applied, the portion is made to be conductive in the thickness direction of the film. As another example, the conductive material may be disposed through the insulating base member in the Z-axis direction to provide conductivity in the thickness direction of the film. In this case, the conductive material may have a pointed end.

The ACF may be a fixed array ACF in which conductive balls are inserted into one surface of the insulating base member. More specifically, the insulating base member may be formed of an adhesive material, and the conductive balls may be intensively disposed on the bottom portion of the insulating base member. Thus, when the base member is subjected to heat and pressure, it may be deformed together with the conductive balls, exhibiting conductivity in the vertical direction.

However, the present disclosure is not necessarily limited thereto, and the ACF may be formed by randomly mixing conductive balls in the insulating base member, or may be composed of a plurality of layers with conductive balls arranged on one of the layers (as a double-ACF).

The anisotropic conductive paste may be a combination of a paste and conductive balls, and may be a paste in which conductive balls are mixed with an insulating and adhesive base material. Also, the solution containing conductive particles may be a solution containing any conductive particles or nanoparticles.

Referring back to FIG. 3A, the second electrode 140 is positioned on the insulating layer 160 and spaced apart from the auxiliary electrode 170. That is, the conductive adhesive layer 130 is disposed on the insulating layer 160 having the auxiliary electrode 170 and the second electrode 140 positioned thereon.

After the conductive adhesive layer 130 is formed with the auxiliary electrode 170 and the second electrode 140 positioned on the insulating layer 160, the semiconductor light emitting element 150 is connected thereto in a flip-chip form by applying heat and pressure. Thereby, the semiconductor light emitting element 150 is electrically connected to the first electrode 120 and the second electrode 140.

Referring to FIG. 4, the semiconductor light emitting element may be a flip chip-type light emitting device.

For example, the semiconductor light emitting element may include a p-type electrode 156, a p-type semiconductor layer 155 on which the p-type electrode 156 is formed, an active layer 154 formed on the p-type semiconductor layer 155, an n-type semiconductor layer 153 formed on the active layer 154, and an n-type electrode 152 disposed on the n-type semiconductor layer 153 and horizontally spaced apart from the p-type electrode 156. In this case, the p-type electrode 156 may be electrically connected to the auxiliary electrode 170, which is shown in FIG. 3, by the conductive adhesive layer 130, and the n-type electrode 152 may be electrically connected to the second electrode 140.

Referring back to FIGS. 2, 3A and 3B, the auxiliary electrode 170 may be elongated in one direction. Thus, one auxiliary electrode may be electrically connected to the plurality of semiconductor light emitting elements 150. For example, p-type electrodes of semiconductor light emitting elements on left and right sides of an auxiliary electrode may be electrically connected to one auxiliary electrode.

More specifically, the semiconductor light emitting element 150 may be press-fitted into the conductive adhesive layer 130 by heat and pressure. Thereby, only the portions of the semiconductor light emitting element 150 between the p-type electrode 156 and the auxiliary electrode 170 and between the n-type electrode 152 and the second electrode 140 may exhibit conductivity, and the other portions of the semiconductor light emitting element 150 do not exhibit conductivity as they are not press-fitted. In this way, the conductive adhesive layer 130 interconnects and electrically connects the semiconductor light emitting element 150 and the auxiliary electrode 170 and interconnects and electrically connects the semiconductor light emitting element 150 and the second electrode 140.

The plurality of semiconductor light emitting elements 150 may constitute a light emitting device array, and a phosphor conversion layer 180 may be formed on the light emitting device array.

The light emitting device array may include a plurality of semiconductor light emitting elements having different luminance values. Each semiconductor light emitting element 150 may constitute a unit pixel and may be electrically connected to the first electrode 120. For example, a plurality of first electrodes 120 may be provided, and the semiconductor light emitting elements may be arranged in, for example, several columns. The semiconductor light emitting elements in each column may be electrically connected to any one of the plurality of first electrodes.

In addition, since the semiconductor light emitting elements are connected in a flip-chip form, semiconductor light emitting elements grown on a transparent dielectric substrate may be used. The semiconductor light emitting elements may be, for example, nitride semiconductor light emitting elements. Since the semiconductor light emitting element 150 has excellent luminance, it may constitute an individual unit pixel even when it has a small size.

As shown in FIG. 3, a partition wall 190 may be formed between the semiconductor light emitting elements 150. In this case, the partition wall 190 may serve to separate individual unit pixels from each other, and may be integrated with the conductive adhesive layer 130. For example, by inserting the semiconductor light emitting element 150 into the ACF, the base member of the ACF may form the partition wall.

In addition, when the base member of the ACF is black, the partition wall 190 may have reflectance and increase contrast even without a separate black insulator.

As another example, a reflective partition wall may be separately provided as the partition wall 190. In this case, the partition wall 190 may include a black or white insulator depending on the purpose of the display device. When a partition wall including a white insulator is used, reflectivity may be increased. When a partition wall including a black insulator is used, it may have reflectance and increase contrast.

The phosphor conversion layer 180 may be positioned on the outer surface of the semiconductor light emitting element 150. For example, the semiconductor light emitting element 150 may be a blue semiconductor light emitting element that emits blue (B) light, and the phosphor conversion layer 180 may function to convert the blue (B) light into a color of a unit pixel. The phosphor conversion layer 180 may be a red phosphor 181 or a green phosphor 182 constituting an individual pixel.

That is, the red phosphor 181 capable of converting blue light into red (R) light may be laminated on a blue semiconductor light emitting element at a position of a unit pixel of red color, and the green phosphor 182 capable of converting blue light into green (G) light may be laminated on the blue semiconductor light emitting element at a position of a unit pixel of green color. Only the blue semiconductor light emitting element may be used alone in the portion constituting the unit pixel of blue color. In this case, unit pixels of red (R), green (G), and blue (B) may constitute one pixel. More specifically, a phosphor of one color may be laminated along each line of the first electrode 120. Accordingly, one line on the first electrode 120 may be an electrode for controlling one color. That is, red (R), green (G), and blue (B) may be sequentially disposed along the second electrode 140, thereby implementing a unit pixel.

However, embodiments of the present disclosure are not limited thereto. Unit pixels of red (R), green (G), and blue (B) may be implemented by combining the semiconductor light emitting element 150 and the quantum dot (QD) rather than using the phosphor.

Also, a black matrix 191 may be disposed between the phosphor conversion layers to improve contrast. That is, the black matrix 191 may improve contrast of light and darkness.

However, embodiments of the present disclosure are not limited thereto, and anther structure may be applied to implement blue, red, and green colors.

Referring to FIG. 5A, each semiconductor light emitting element may be implemented as a high-power light emitting device emitting light of various colors including blue by using gallium nitride (GaN) as a main material and adding indium (In) and/or aluminum (Al).

In this case, each semiconductor light emitting element may be a red, green, or blue semiconductor light emitting element to form a unit pixel (sub-pixel). For example, red, green, and blue semiconductor light emitting elements R, G, and B may be alternately disposed, and unit pixels of red, green, and blue may constitute one pixel by the red, green and blue semiconductor light emitting elements. Thereby, a full-color display may be implemented.

Referring to FIG. 5B, the semiconductor light emitting element 150a may include a white light emitting device W having a yellow phosphor conversion layer, which is provided for each device. In this case, in order to form a unit pixel, a red phosphor conversion layer 181, a green phosphor conversion layer 182, and a blue phosphor conversion layer 183 may be disposed on the white light emitting device W. In addition, a unit pixel may be formed using a color filter repeating red, green, and blue on the white light emitting device W.

Referring to FIG. 5C, a red phosphor conversion layer 181, a green phosphor conversion layer 185, and a blue phosphor conversion layer 183 may be provided on a ultraviolet light emitting device. Not only visible light but also ultraviolet (UV) light may be used in the entire region of the semiconductor light emitting element. In an embodiment, UV may be used as an excitation source of the upper phosphor in the semiconductor light emitting element.

Referring back to this example, the semiconductor light emitting element is positioned on the conductive adhesive layer to constitute a unit pixel in the display device. Since the semiconductor light emitting element has excellent luminance, individual unit pixels may be configured despite even when the semiconductor light emitting element has a small size.

Regarding the size of such an individual semiconductor light emitting element, the length of each side of the device may be, for example, 80 μm or less, and the device may have a rectangular or square shape. When the semiconductor light emitting element has a rectangular shape, the size thereof may be less than or equal to 20 μm×80 μm.

In addition, even when a square semiconductor light emitting element having a side length of 10 μm is used as a unit pixel, sufficient brightness to form a display device may be obtained.

Therefore, for example, in case of a rectangular pixel having a unit pixel size of 600 μm×300 μm (i.e., one side by the other side), a distance of a semiconductor light emitting element becomes sufficiently long relatively.

Thus, in this case, it is able to implement a flexible display device having high image quality over HD image quality.

The above-described display device using the semiconductor light emitting element may be prepared by a new fabricating method. Such a fabricating method will be described with reference to FIG. 6 as follows.

Figure 6:
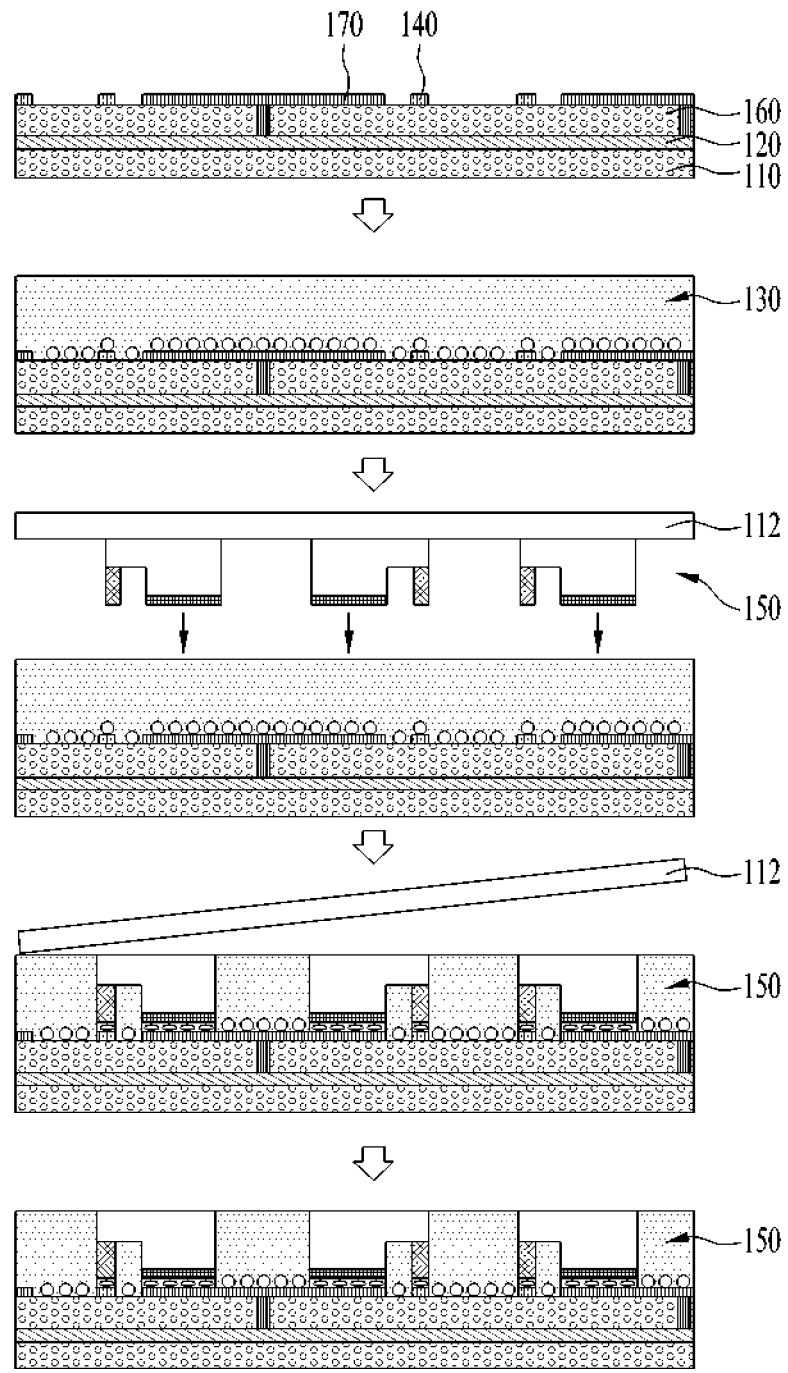
FIG. 6 shows cross-sectional views of a method of fabricating a display device using a semiconductor light emitting element according to the present disclosure.

FIG. 6 shows cross-sectional views of a method of fabricating a display device using a semiconductor light emitting element according to the present disclosure.

Referring to FIG. 6, first of all, a conductive adhesive layer 130 is formed on an insulating layer 160 located between an auxiliary electrode 170 and a second electrode 140. The insulating layer 160 is tacked on a wiring substrate 110. On the wiring substrate 110, a first electrode 120, the auxiliary electrode 170 and the second electrode 140 are disposed. In this case, the first electrode 120 and the second electrode 140 may be disposed in mutually orthogonal directions, respectively. In order to implement a flexible display device, the wiring substrate 110 and the insulating layer 160 may include glass or polyimide (PI) each.

For example, the conductive adhesive layer 130 may be implemented by an anisotropic conductive film. To this end, an anisotropic conductive film may be coated on the substrate on which the insulating layer 160 is located.

Subsequently, a temporary substrate 112, on which a plurality of semiconductor light emitting elements 150 configuring individual pixels are located to correspond to locations of the auxiliary electrode 170 and the second electrodes 140, is disposed in a manner that the semiconductor light emitting element 150 confronts the auxiliary electrode 170 and the second electrode 140.

In this regard, the temporary 112 substrate 112 is a growing substrate for growing the semiconductor light emitting element 150 and may include a sapphire or silicon substrate.

The semiconductor light emitting element is configured to have a space and size for configuring a display device when formed in unit of wafer, thereby being effectively used for the display device.

Subsequently, the wiring substrate 110 and the temporary substrate 112 are thermally compressed together. By the thermocompression, the wiring substrate 110 and the temporary substrate 112 are bonded together. Owing to the property of an anisotropic conductive film having conductivity by thermocompression, only a portion among the semiconductor light emitting element 150, the auxiliary electrode 170 and the second electrode 140 has conductivity, via which the electrodes and the semiconductor light emitting element 150 may be connected electrically. In this case, the semiconductor light emitting element 150 is inserted into the anisotropic conductive film, by which a partition may be formed between the semiconductor light emitting elements 150.

Then the temporary substrate 112 is removed. For example, the temporary substrate 112 may be removed using Laser Lift-Off (LLO) or Chemical Lift-Off (CLO).

Finally, by removing the temporary substrate 112, the semiconductor light emitting elements 150 exposed externally. If necessary, the wiring substrate 110 to which the semiconductor light emitting elements 150 are coupled may be coated with silicon oxide (SiOx) or the like to form a transparent insulating layer (not shown).

In addition, a step of forming a phosphor layer on one side of the semiconductor light emitting element 150 may be further included. For example, the semiconductor light emitting element 150 may include a blue semiconductor light emitting element emitting Blue (B) light, and a red or green phosphor for converting the blue (B) light into a color of a unit pixel may form a layer on one side of the blue semiconductor light emitting element.

The above-described fabricating method or structure of the display device using the semiconductor light emitting element may be modified into various forms. For example, the above-described display device may employ a vertical type semiconductor light emitting element.

Furthermore, a modification or embodiment described in the following may use the same or similar reference numbers for the same or similar configurations of the former example and the former description may apply thereto.

Figure 7:
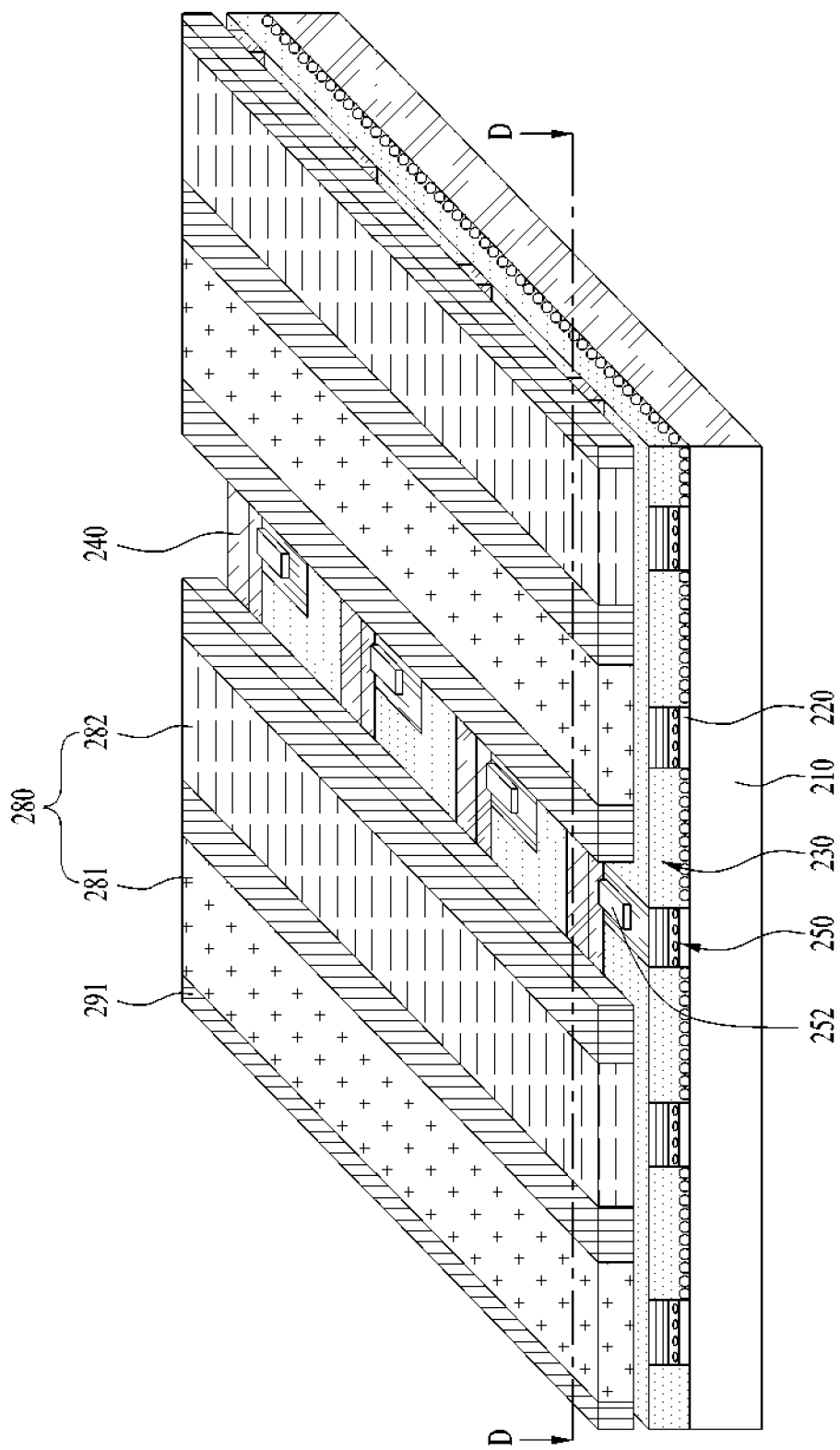
FIG. 7 is a perspective diagram of a display device using a semiconductor light emitting element according to another embodiment of the present disclosure.
Figure 8:
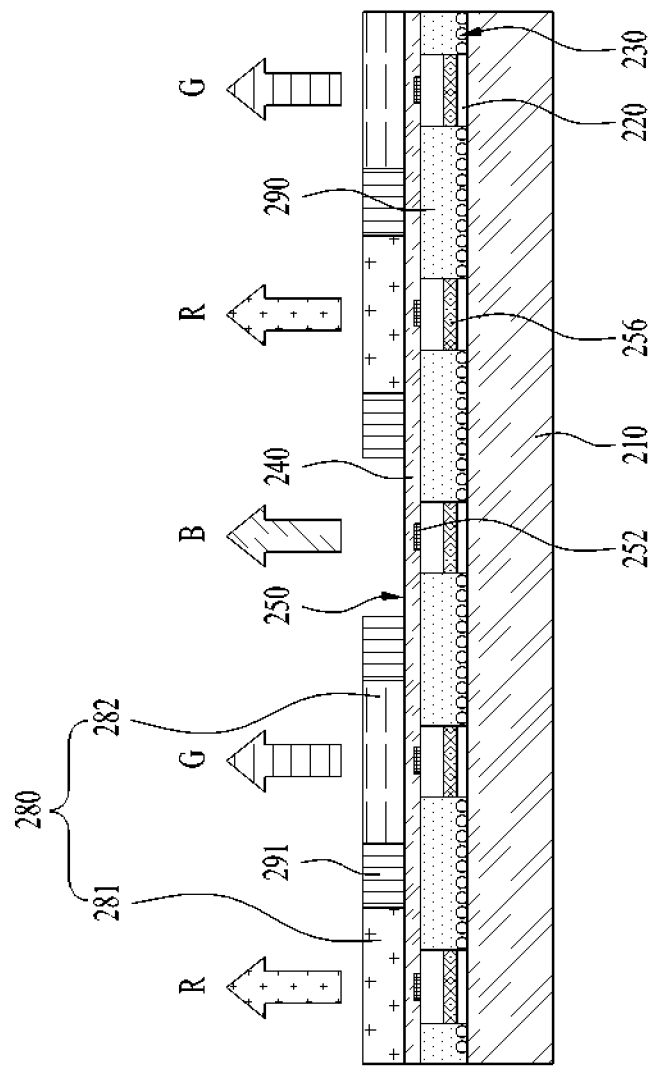
FIG. 8 is a cross-sectional diagram taken along a cutting line D-D shown in FIG. 7.
Figure 9:
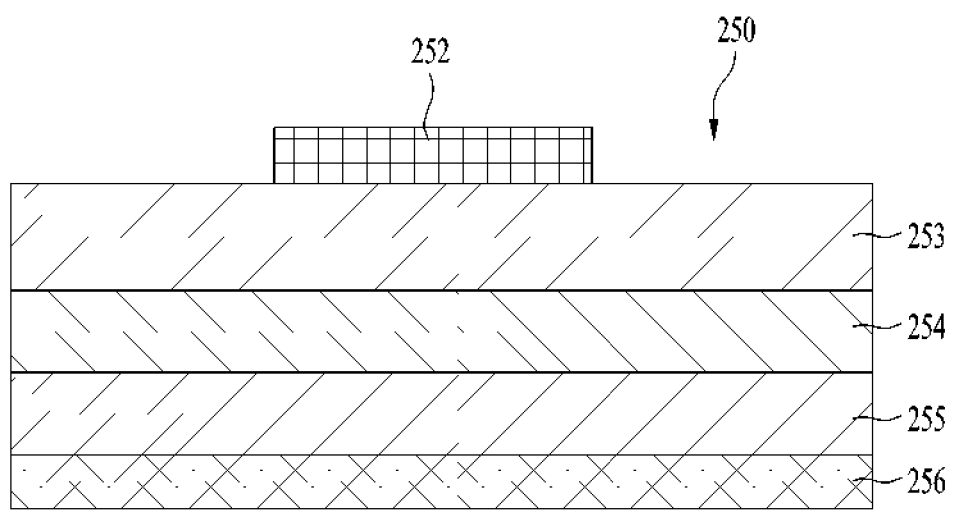
FIG. 9 is a conceptual diagram showing a vertical type semiconductor light emitting element shown in FIG. 8.

FIG. 7 is a perspective diagram of a display device using a semiconductor light emitting element according to another embodiment of the present disclosure, FIG. 8 is a cross-sectional diagram taken along a cutting line D-D shown in FIG. 7, and FIG. 9 is a conceptual diagram showing a vertical type semiconductor light emitting element shown in FIG. 8.

Referring to the present drawings, a display device may employ a vertical type semiconductor light emitting device of a Passive Matrix (PM) type.

The display device includes a substrate 210, a first electrode 220, a conductive adhesive layer 230, a second electrode 240 and at least one semiconductor light emitting element 250.

The substrate 210 is a wiring substrate on which the first electrode 220 is disposed and may contain polyimide (PI) to implement a flexible display device. Besides, the substrate 210 may use any substance that is insulating and flexible.

The first electrode 210 is located on the substrate 210 and may be formed as a bar type electrode that is long in one direction. The first electrode 220 may be configured to play a role as a data electrode.

The conductive adhesive layer 230 is formed on the substrate 210 where the first electrode 220 is located. Like a display device to which a light emitting device of a flip chip type is applied, the conductive adhesive layer 230 may include one of an Anisotropic Conductive Film (ACF), an anisotropic conductive paste, a conductive particle contained solution and the like. Yet, in the present embodiment, a case of implementing the conductive adhesive layer 230 with the anisotropic conductive film is exemplified.

After the conductive adhesive layer has been placed in the state that the first electrode 220 is located on the substrate 210, if the semiconductor light emitting element 250 is connected by applying heat and pressure thereto, the semiconductor light emitting element 250 is electrically connected to the first electrode 220. In doing so, the semiconductor light emitting element 250 is preferably disposed to be located on the first electrode 220.

If heat and pressure is applied to an anisotropic conductive film, as described above, since the anisotropic conductive film has conductivity partially in a thickness direction, the electrical connection is established. Therefore, the anisotropic conductive film is partitioned into a conductive portion and a non-conductive portion.

Furthermore, since the anisotropic conductive film contains an adhesive component, the conductive adhesive layer 230 implements mechanical coupling between the semiconductor light emitting element 250 and the first electrode 220 as well as mechanical connection.

Thus, the semiconductor light emitting element 250 is located on the conductive adhesive layer 230, via which an individual pixel is configured in the display device. As the semiconductor light emitting element 250 has excellent luminance, an individual unit pixel may be configured in small size as well. Regarding a size of the individual semiconductor light emitting element 250, a length of one side may be equal to or smaller than 80 μm for example and the individual semiconductor light emitting element 250 may include a rectangular or square element. For example, the rectangular element may have a size equal to or smaller than 20 μm×80 μm.

The semiconductor light emitting element 250 may have a vertical structure.

Among the vertical type semiconductor light emitting elements, a plurality of second electrodes 240 respectively and electrically connected to the vertical type semiconductor light emitting elements 250 are located in a manner of being disposed in a direction crossing with a length direction of the first electrode 220.

Referring to FIG. 9, the vertical type semiconductor light emitting element 250 includes a p-type electrode 256, a p-type semiconductor layer 255 formed on the p-type electrode 256, an active layer 254 formed on the p-type semiconductor layer 255, an n-type semiconductor layer 253 formed on the active layer 254, and an n-type electrode 252 formed on then-type semiconductor layer 253. In this case, the p-type electrode 256 located on a bottom side may be electrically connected to the first electrode 220 by the conductive adhesive layer 230, and the n-type electrode 252 located on a top side may be electrically connected to a second electrode 240 described later. Since such a vertical type semiconductor light emitting element 250 can dispose the electrodes at top and bottom, it is considerably advantageous in reducing a chip size.

Referring to FIG. 8 again, a phosphor layer 280 may formed on one side of the semiconductor light emitting element 250. For example, the semiconductor light emitting element 250 may include a blue semiconductor light emitting element 251 emitting blue (B) light, and a phosphor layer 280 for converting the blue (B) light into a color of a unit pixel may be provided. In this regard, the phosphor layer 280 may include a red phosphor 281 and a green phosphor 282 configuring an individual pixel.

Namely, at a location of configuring a red unit pixel, the red phosphor 281 capable of converting blue light into red (R) light may be stacked on a blue semiconductor light emitting element. At a location of configuring a green unit pixel, the green phosphor 282 capable of converting blue light into green (G) light may be stacked on the blue semiconductor light emitting element. Moreover, the blue semiconductor light emitting element may be singly usable for a portion that configures a blue unit pixel. In this case, the unit pixels of red (R), green (G) and blue (B) may configure a single pixel.

Yet, the present disclosure is non-limited by the above description. In a display device to which a light emitting element of a flip chip type is applied, as described above, a different structure for implementing blue, red and green may be applicable.

Regarding the present embodiment again, the second electrode 240 is located between the semiconductor light emitting elements 250 and connected to the semiconductor light emitting elements electrically. For example, the semiconductor light emitting elements 250 are disposed in a plurality of columns, and the second electrode 240 may be located between the columns of the semiconductor light emitting elements 250.

Since a distance between the semiconductor light emitting elements 250 configuring the individual pixel is sufficiently long, the second electrode 240 may be located between the semiconductor light emitting elements 250.

The second electrode 240 may be formed as an electrode of a bar type that is long in one direction and disposed in a direction vertical to the first electrode.

In addition, the second electrode 240 and the semiconductor light emitting element 250 may be electrically connected to each other by a connecting electrode protruding from the second electrode 240. Particularly, the connecting electrode may include an n-type electrode of the semiconductor light emitting element 250. For example, the n-type electrode is formed as an ohmic electrode for ohmic contact, and the second electrode covers at least one portion of the ohmic electrode by printing or deposition. Thus, the second electrode 240 and the n-type electrode of the semiconductor light emitting element 250 may be electrically connected to each other.

Referring to FIG. 8 again, the second electrode 240 may be located on the conductive adhesive layer 230. In some cases, a transparent insulating layer (not shown) containing silicon oxide (SiOx) and the like may be formed on the substrate 210 having the semiconductor light emitting element 250 formed thereon. If the second electrode 240 is placed after the transparent insulating layer has been formed, the second electrode 240 is located on the transparent insulating layer. Alternatively, the second electrode 240 may be formed in a manner of being spaced apart from the conductive adhesive layer 230 or the transparent insulating layer.

If a transparent electrode of Indium Tin Oxide (ITO) or the like is sued to place the second electrode 240 on the semiconductor light emitting element 250, there is a problem that ITO substance has poor adhesiveness to an n-type semiconductor layer. Therefore, according to the present disclosure, as the second electrode 240 is placed between the semiconductor light emitting elements 250, it is advantageous in that a transparent electrode of ITO is not used. Thus, light extraction efficiency can be improved using a conductive substance having good adhesiveness to an n-type semiconductor layer as a horizontal electrode without restriction on transparent substance selection.

Referring to FIG. 8 again, a partition 290 may be located between the semiconductor light emitting elements 250. Namely, in order to isolate the semiconductor light emitting element 250 configuring the individual pixel, the partition 290 may be disposed between the vertical type semiconductor light emitting elements 250. In this case, the partition 290 may play a role in separating the individual unit pixels from each other and be formed with the conductive adhesive layer 230 as an integral part. For example, by inserting the semiconductor light emitting element 250 in an anisotropic conductive film, a base member of the anisotropic conductive film may form the partition.

In addition, if the base member of the anisotropic conductive film is black, the partition 290 may have reflective property as well as a contrast ratio may be increased, without a separate block insulator.

For another example, a reflective partition may be separately provided as the partition 190. The partition 290 may include a black or white insulator depending on the purpose of the display device.

In case that the second electrode 240 is located right onto the conductive adhesive layer 230 between the semiconductor light emitting elements 250, the partition 290 may be located between the vertical type semiconductor light emitting element 250 and the second electrode 240 each. Therefore, an individual unit pixel may be configured using the semiconductor light emitting element 250. Since a distance between the semiconductor light emitting elements 250 is sufficiently long, the second electrode 240 can be placed between the semiconductor light emitting elements 250. And, it may bring an effect of implementing a flexible display device having HD image quality.

In addition, as shown in FIG. 8, a black matrix 291 may be disposed between the respective phosphors for the contrast ratio improvement. Namely, the black matrix 291 may improve the contrast between light and shade.

Figure 10:
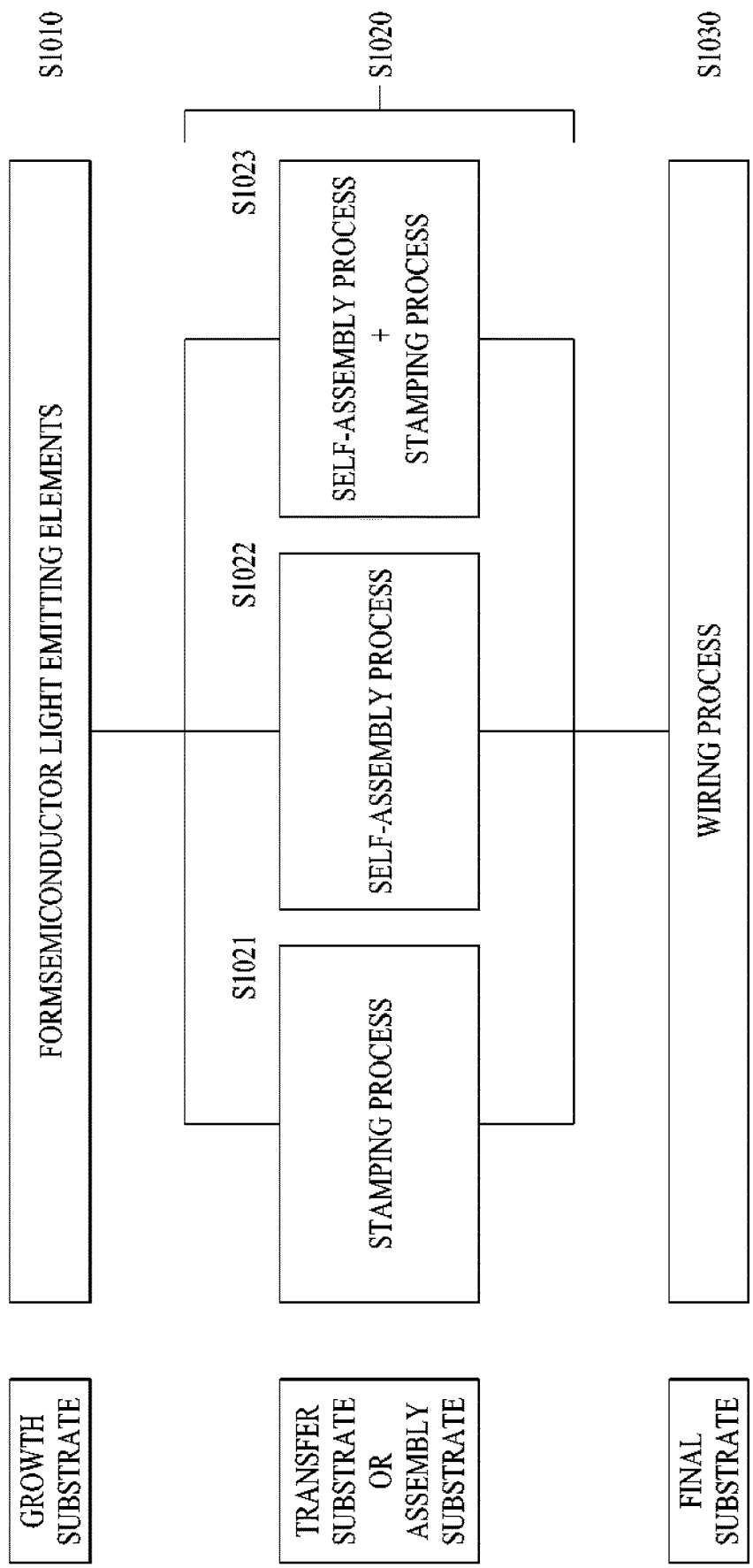
FIG. 10 is a flowchart schematically showing a method of manufacturing a display device using a semiconductor light emitting element.

FIG. 10 is a diagram schematically showing a method of manufacturing a display device using a semiconductor light emitting element.

First, semiconductor light emitting elements are formed on growth substrates (S1010). Each of the semiconductor light emitting elements may include a first conductivity-type semiconductor layer, an active layer, and a second conductivity-type semiconductor layer. In addition, a first conductivity-type electrode, which is formed on the first conductivity-type semiconductor layer, and a second conductivity-type electrode, which is formed on the second conductivity-type semiconductor layer, may be further included.

Either horizontal type semiconductor light emitting elements or vertical type semiconductor light emitting elements may be used as the semiconductor light emitting elements. However, when a vertical type semiconductor light emitting element is used, the first conductivity-type electrode and the second conductivity-type electrode face each other, and thus a process of separating the semiconductor light emitting element from the growth substrate and a subsequent process of forming a conductivity-type electrode in any one direction are performed. Further, as will be described later, the semiconductor light emitting element may include a magnetic layer for the purpose of a self-assembly process.

In order to apply the semiconductor light emitting elements to a display device, in general, three kinds of semiconductor light emitting elements, which respectively emit red (R), green (G), and blue (B) light, are necessary. Since semiconductor light emitting elements configured to emit light of one color are formed on one growth substrate, separate substrates are required to manufacture a display device that implements individual unit pixels using the above three kinds of semiconductor light emitting elements. Therefore, the individual semiconductor light emitting elements need to be separated from the growth substrates and then be assembled to or transferred to a final substrate. The final substrate is a substrate on which a process of forming wiring electrodes for applying voltage to the semiconductor light emitting elements in order to enable the semiconductor light emitting elements to emit light is performed.

Therefore, the semiconductor light emitting elements configured to emit light of respective colors may be primarily moved to a transfer substrate or an assembly substrate (S1020), and may be finally transferred to the final substrate. In some cases, when a wiring process is directly performed on the transfer substrate or the assembly substrate, the transfer substrate or the assembly substrate serves as the final substrate.

The semiconductor light emitting elements may be arranged on the transfer substrate or the assembly substrate through any of the following three methods (S1020).

The first method is to transfer the semiconductor light emitting elements from the growth substrate to the transfer substrate through a stamping process (S1021). The stamping process is a process of separating semiconductor light emitting elements from a growth substrate using a flexible substrate and adhesive protrusions formed on the flexible substrate. The semiconductor light emitting elements may be selectively separated from the growth substrate by adjusting the interval between the protrusions and the arrangement of the protrusions.

The second method is to assemble the semiconductor light emitting elements to the assembly substrate through a self-assembly process (S1022). In order to perform the self-assembly process, the semiconductor light emitting elements need to be separated from the growth substrate in order to be prepared individually, and thus a Laser Lift Off (LLO) process is performed a number of times equal to the number of semiconductor light emitting elements that are required in order to separate the semiconductor light emitting elements from the growth substrate. Thereafter, the semiconductor light emitting elements are dispersed in a fluid, and are assembled to the assembly substrate using an electromagnetic field.

In the self-assembly process, respective semiconductor light emitting elements configured to implement R, G, and B colors may be simultaneously assembled to one assembly substrate, or the semiconductor light emitting elements configured to implement respective colors may be assembled to respective assembly substrates.

The third method is to combine the stamping process and the self-assembly process (S1023). The semiconductor light emitting elements are first placed on the assembly substrate through the self-assembly process, and then are transferred to the final substrate through the stamping process. Since it is difficult to implement an assembly substrate having a large area due to the position of the assembly substrate, contact with the fluid, and the influence of the electromagnetic field during the self-assembly process, the semiconductor light emitting elements may be assembled to an assembly substrate having an appropriate area, and may then be transferred multiple times to the final substrate, having a large area, through the stamping process.

When the plurality of semiconductor light emitting elements constituting respective unit pixels is disposed on the final substrate, a wiring process is performed in order to electrically interconnect the semiconductor light emitting elements (S1030).

Wiring electrodes formed through the wiring process electrically connect the semiconductor light emitting elements, assembled to or transferred to the substrate, to the substrate. Further, transistors for driving an active matrix may be formed in advance on the lower surface of the substrate. Thereby, the wiring electrodes may be electrically connected to the transistors.

In order to implement a large-scale display device, a large number of semiconductor light emitting elements is required, and thus a self-assembly process is desirable. Further, in order to increase the assembly speed, simultaneous assembly of the semiconductor light emitting elements configured to implement respective colors to one assembly substrate may be preferred during the self-assembly process. Further, in order to assemble the semiconductor light emitting elements configured to implement respective colors at predetermined specific positions on the assembly substrate, the semiconductor light emitting elements may be required to have mutually different structures.

Figure 11:
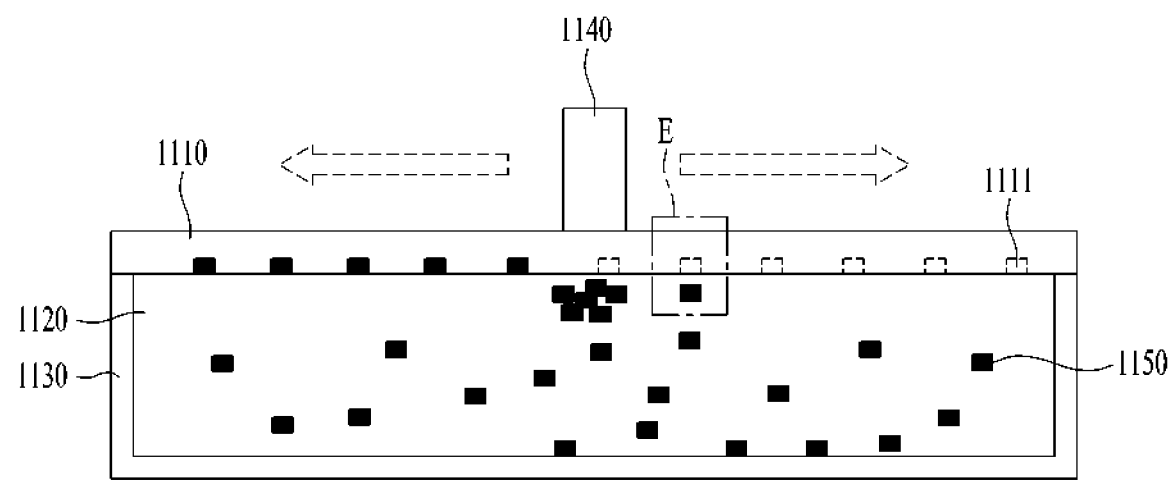
FIG. 11 is a diagram showing one embodiment of a method of assembling semiconductor light emitting elements to a substrate through a self-assembly process.

FIG. 11 is a diagram showing one embodiment of a method of assembling semiconductor light emitting elements to a substrate through the self-assembly process.

Figure 12:
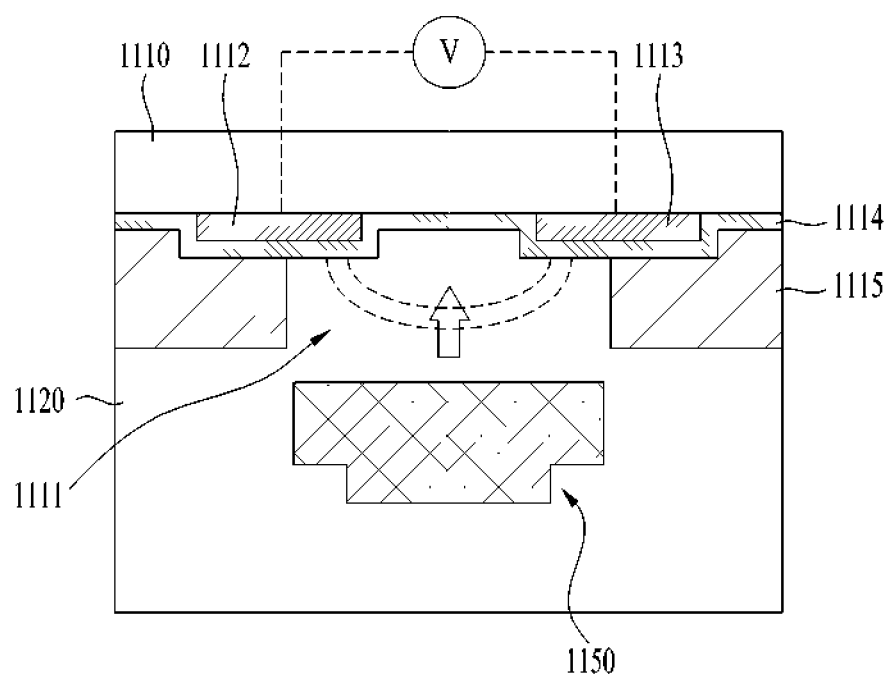
FIG. 12 is an enlarged diagram of a part E in FIG. 11.

FIG. 12 is an enlarged diagram of a part E in FIG. 11.

Referring to FIGS. 11 and 12, semiconductor light emitting elements 1150 may be put into a chamber 1130 filled with a fluid 1120.

Thereafter, an assembly substrate 1110 may be placed on the chamber 1130. In some embodiments, the assembly substrate 1110 may be put into the chamber 1130. In this case, the assembly substrate 1110 is put into the chamber 1130 in the direction in which assembly recesses 1111 in the assembly substrate 1110 face the fluid 1120.

A pair of electrodes 1112 and 1113 corresponding to each of the semiconductor light emitting elements 1150 to be assembled to the assembly substrate 1110 may be formed on the assembly substrate 1110. The electrodes 1112 and 1113 may be implemented as transparent electrodes (formed of ITO), or may be formed of other general materials. The electrodes 1112 and 1113 correspond to assembly electrodes that generate an electric field upon application of voltage thereto and thus stably fix the semiconductor light emitting elements 1150 brought into contact with the assembly recesses 1112 and 1113.

Specifically, AC voltage may be applied to the electrodes 1112 and 1113, and the semiconductor light emitting element 1150, which floats around the electrodes 1112 and 1113, may be imparted with polarity due to dielectric polarization. Further, the dielectrically polarized semiconductor light emitting element may be moved in a specific direction, or may be fixed by a non-uniform electric field formed around the electrodes 1112 and 1113. This may be referred to as dielectrophoresis (DEP) and, during the self-assembly process according to the present disclosure, the semiconductor light emitting elements 1150 may be stably fixed to the assembly recesses 1111 using dielectrophoresis. The intensity of dielectrophoresis (DEP force) is proportional to the intensity of an electric field, and thus varies depending on the extent of dielectric polarization in the semiconductor light emitting elements.

Further, the distance between the assembly electrodes 1112 and 1113 may be less than, for example, the width of the semiconductor light emitting elements 1150 and the diameter of the assembly recesses 1111, thereby enabling the semiconductor light emitting elements 1150 to be more precisely fixed at the assembly positions thereof using an electric field.

Further, an insulating layer 1114 may be formed on the assembly electrodes 1112 and 1113 in order to protect the electrodes 1112 and 1113 from the fluid 1120 and to prevent leakage of current flowing through the assembly electrodes 1112 and 1113. For example, the insulating layer 1114 may be formed in a single-layer structure or a multilayer structure using an inorganic insulator, such as silica or alumina, or an organic insulator. Further, the insulating layer 1114 may have a minimum thickness to prevent damage to the assembly electrodes 1112 and 1113 when the semiconductor light emitting elements 1150 are assembled to the assembly electrodes 1112 and 1113, and may have a maximum thickness to stably assemble the semiconductor light emitting elements 1150.

A partition wall 1115 may be formed on the insulting layer 1114. Some regions of the partition wall 1115 may be located on the assembly electrodes 1112 and 1113, and remaining regions may be located on the assembly substrate 1110.

For example, when the assembly substrate 1110 is manufactured, the assembly recesses 1111 through which the respective semiconductor light emitting elements 1150 are coupled to the assembly substrate 1110 may be formed by removing some parts of the partition wall formed on the entire surface of the insulating layer 1114.

As shown in FIG. 12, the assembly recesses 1111 to which the semiconductor light emitting elements 1150 are coupled may be formed in the assembly substrate 1110, and the surface of the assembly substrate 1110 in which the assembly recesses 1111 are formed may be in contact with the fluid 1120. The assembly recesses 1111 may accurately guide the semiconductor light emitting elements 1150 to the assembly positions thereof.

Further, the partition wall 1115 may be formed to have a designated inclination in a direction from the opening in the assembly recess 1111 to the bottom surface of the assembly recess 1111. For example, the assembly recess 1111 may have the opening and the bottom surface, and the area of the opening may be formed to be greater than the area of the bottom surface by adjusting the inclination of the partition wall 1115. Thereby, the semiconductor light emitting element 1150 may be accurately placed in position in the bottom surface of the assembly recess 1111.

The assembly recess 1111 may have a shape and a size corresponding to the shape of the semiconductor light emitting element 1150 to be assembled thereto. Accordingly, it may be possible to prevent another semiconductor light emitting element or a plurality of semiconductor light emitting elements from being assembled to the corresponding assembly recess 1111.

Further, the depth of the assembly recesses 1111 may be formed to be less than the vertical height of the semiconductor light emitting elements 1150. Therefore, the semiconductor light emitting elements 1150 may protrude above the partition wall 1115, and may thus easily come into contact with protrusions of a transfer substrate during a transfer process, which may be performed after assembly.

Further, after the assembly substrate 1110 is disposed, as shown in FIG. 12, an assembly device 1140 including a magnetic body may move along the assembly substrate 1110. The assembly device 1140 may move in the state in which the assembly device 1140 is in contact with the assembly substrate 1110 in order to maximize the range within which a magnetic field acts on the fluid 1120. For example, the assembly device 1140 may include a plurality of magnetic bodies, or may include a magnetic body having a size corresponding to the size of the assembly substrate 1110. In this case, the distance that the assembly device 1140 is capable of moving may be restricted to within a designated range.

The semiconductor light emitting elements 1150 in the chamber 1130 may be moved toward the assembly device 1140 by the magnetic field generated by the assembly device 1140.

When the semiconductor light emitting elements 1150 move toward the assembly device 1140, the semiconductor light emitting elements 1150 may enter the assembly recesses 1111 and come into contact with the assembly substrate 1110, as shown in FIG. 12.

Further, the semiconductor light emitting elements 1150 may include a magnetic layer formed therein so as to perform the self-assembly process.

Further, due to the electric field generated by the assembly electrodes 1112 and 1113 of the assembly substrate 1110, the semiconductor light emitting elements 1150 that are in contact with the assembly substrate 1110 may be prevented from being released by movement of the assembly device 1140.

Therefore, the plurality of semiconductor light emitting elements 1150 may be simultaneously assembled to the assembly substrate 1110 through the self-assembly method using an electromagnetic field, as shown in FIGS. 11 and 12.

Figure 13:
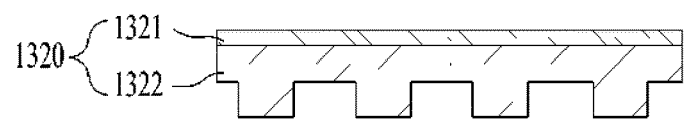
FIG. 13 illustrates cross-sectional diagrams showing a method of manufacturing a display device using a transfer substrate.
Figure 13:
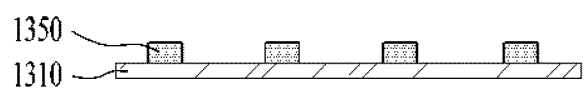
Figure 13:
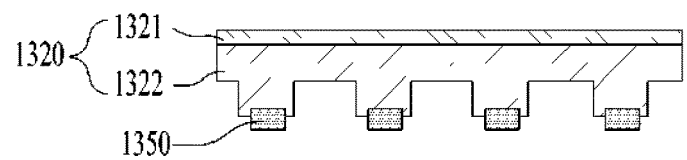
Figure 13:
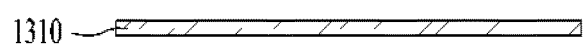
Figure 13:
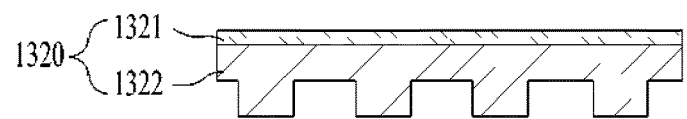
Figure 13:
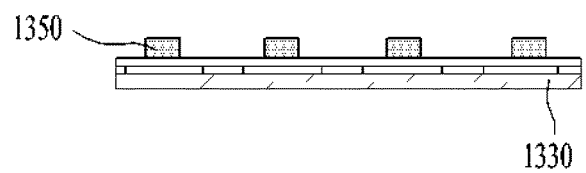

FIG. 13 illustrates cross-sectional diagrams for explaining a process of manufacturing a display device using a transfer substrate.

In the case of a large-screen high-pixel display device using semiconductor light emitting elements, the semiconductor light emitting elements formed on a growth substrate need to be assembled or transferred to a new substrate. The growth substrate may be, for example, an 8-inch wafer, so the transfer operation may be repeated multiple times.

FIG. 13(*a*) illustrates a cross-sectional diagram showing the state in which a semiconductor light emitting element 1350 provided on a growth substrate 1310 faces and is aligned with a transfer substrate 1320 including a base layer 1321 and an organic stamp layer 1322.

The semiconductor light emitting element 1350 formed on the growth substrate 1310 may include a first conductivity-type semiconductor layer, a second conductivity-type semiconductor layer, an active layer, and conductivity-type electrodes respectively deposited on the conductivity-type semiconductor layers. The semiconductor light emitting element 1350 may be a vertical type semiconductor light emitting element, in which the conductivity-type electrodes face each other, or a horizontal type semiconductor light emitting element, in which the conductivity-type electrodes are oriented in the same direction.

A vertical type semiconductor light emitting element may be processed such that a conductivity-type electrode oriented in one direction is formed on a growth substrate and a conductivity-type electrode oriented in another direction is formed after a transfer process. A horizontal type semiconductor light emitting element may be processed such that all of conductivity-type electrodes are formed on a growth substrate.

Further, when transferred to a final wiring substrate, a horizontal type semiconductor light emitting element may be transferred in a flip-chip structure.

The growth substrate 1310 may be substituted with an assembly substrate. Here, as described above with reference to FIGS. 11 and 12, the assembly substrate may be a substrate to which a semiconductor light emitting element is assembled in a fluid by an electromagnetic field. That is, it can be understood that FIG. 13(*a*) shows the case in which the semiconductor light emitting element located on the growth substrate or the assembly substrate is transferred to the transfer substrate.

Further, the organic stamp layer 1322 of the transfer substrate 1320 is sufficiently adhesive to hold the semiconductor light emitting element 1350 transferred thereto.

Furthermore, the organic stamp layer 1322 may be provided with protrusions arranged at a regular interval corresponding to the interval at which the semiconductor light emitting elements 1350 are arranged on the growth substrate 1310. An alignment process may be performed for accurate transfer of the semiconductor light emitting elements to the protrusions.

The alignment process is performed, for example, by horizontally moving any one of the growth substrate 1310 and the transfer substrate 1320 relative to the other thereof and then vertically moving the same relative to the other one. Thereafter, a determination is made as to whether each of the semiconductor light emitting elements 1350 on the growth substrate 1310 is aligned with a corresponding one of the protrusions of the transfer substrate 1320, using a camera sensor or the like, and if alignment is satisfied, each of the semiconductor light emitting elements 1350 is transferred to a corresponding one of the protrusions. Therefore, the growth substrate 1310 may be made of a light-transmissive material in order to enable observation of the positions of the semiconductor light emitting elements using the camera.

As shown in FIG. 13(*b*), the semiconductor light emitting elements 1350 are stably transferred to the protrusions of the organic stamp layer 1322 of the transfer substrate 1320.

The organic stamp layer 1322 may be made of a flexible film material such as polydimethylsiloxane (PDMS), and the base layer 1321 of the transfer substrate 1320 may include at least one of polyethylene terephthalate (PET), polycarboxylate ether (PCE), or glass. Accordingly, the base layer 1321 may stably support the organic stamp layer 1322 during the transfer process.

In addition, a Laser Lift Off (LLO) process may be performed in order to selectively separate the semiconductor light emitting elements 1350 in the process of transferring the semiconductor light emitting elements 1350 from the growth substrate 1310 to the transfer substrate 1320. That is, when a laser is radiated to a specific region of the growth substrate 1310, in which a semiconductor light emitting element 1350 to be separated is located, the interface of the specific region may change, whereby the corresponding semiconductor light emitting element 1350 may be selectively separated from the growth substrate 1310.

FIG. 13(*c*) is a cross-sectional diagram showing the state in which the semiconductor light emitting elements 1350 are transferred from the organic stamp layer 1322 of the transfer substrate 1320 to a wiring substrate 1330.

As described above, the base layer 1321 of the transfer substrate 1320 serves to stably support the organic stamp layer 1322 of the transfer substrate 1310 in a substrate-to-substrate pressing process during transfer. In general, the pressing process is a process of applying mechanical pressure to the substrates using a pressing machine such as a press.

Meanwhile, electrode portions may be formed in advance on the wiring substrate 1330 in order to electrically interconnect the semiconductor light emitting elements 1350 and the wiring substrate 1330. In addition, an adhesive layer may be formed in advance on the wiring substrate 1330 in order to reliably fix the semiconductor light emitting elements 1350 to the wiring substrate 1330. Further, the adhesive layer may be, for example, an anisotropic conductive adhesive layer, and a wiring process may be performed simultaneously with transfer of the semiconductor light emitting elements 1350.

Meanwhile, it has been described above that the transfer process is performed twice in the manufacture of the display device using the transfer substrate 1320 shown in FIG. 13, but the present disclosure is not limited thereto. For example, an additional transfer process may be performed in order to form a conductivity-type electrode for a vertical type semiconductor light emitting element or to form a light extraction structure of a semiconductor light emitting element.

Figure 14:
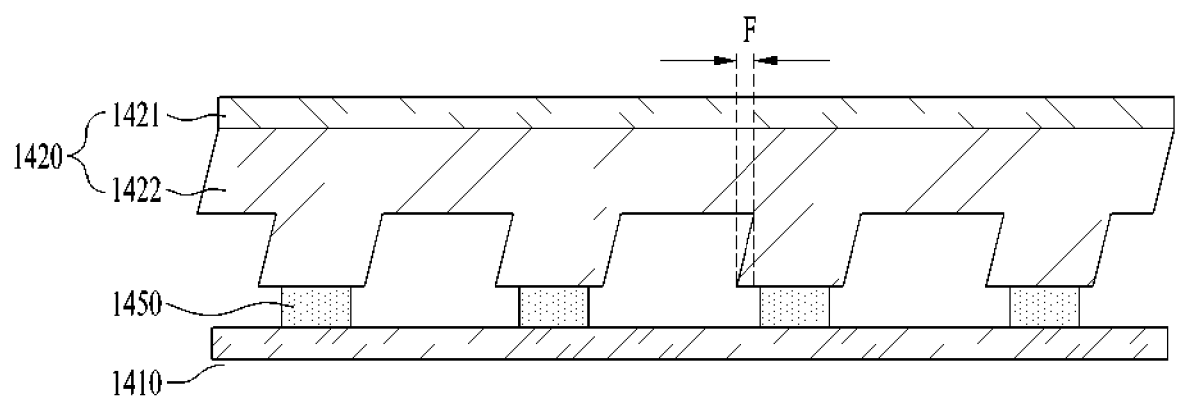
FIG. 14 is a diagram showing arrangement error that may occur in a conventional method of transferring semiconductor light emitting elements.

FIG. 14 is a diagram showing arrangement error that may occur in a conventional method of transferring semiconductor light emitting elements.

A conventional transfer substrate is made of an organic material such as PDMS, and is provided with a plurality of protrusions to which individual semiconductor light emitting elements are transferred.

FIG. 14 is a cross-sectional diagram showing transfer of semiconductor light emitting elements 1450, formed on a growth substrate 1410, to a transfer substrate 1420. As described above, the semiconductor light emitting elements 1450 may be transferred from the assembly substrate to the transfer substrate 1420.

The transfer substrate 1420 may be provided with an organic stamp layer 1422 and a base layer 1421. The organic stamp layer 1422 is illustrated in FIG. 14 as being provided with protrusions formed at positions corresponding to the arrangement of the semiconductor light emitting elements 1450. However, in some cases, the protrusions may be omitted.

The organic stamp layer 1422 may be made of a flexible and adhesive material. As shown in FIG. 14, when the growth substrate 1410 and the transfer substrate 1420 are pressed, the organic stamp layer 1422 may change in shape. In general, the pressing process is performed such that mechanical pressure is applied to the rear surface of the transfer substrate 1420 in order to bring the organic stamp layer 1422 into contact with the semiconductor light emitting elements 1450. At this time, the organic stamp layer 1422 may be deformed by heat and pressure generated during the pressing process. In particular, if the organic stamp layer 1422 is not flat, arrangement error, indicated by "F" in FIG. 14, may occur. The arrangement error F may also occur when the semiconductor light emitting elements are transferred from the transfer substrate 1420 to the wiring substrate, and accordingly, the semiconductor light emitting elements transferred to the wiring substrate may not be disposed at desired positions. Thus, short circuits or open defects are highly likely to occur in a subsequent wiring process.

It has been observed through experimentation that the arrangement error F is likely to cause defects in a subsequent process when the organic stamp layer 1422 has a roughness of 5 μm or greater. Therefore, in a general pressing process, a transfer substrate having a roughness of 5 μm or less is required, which restricts the size to which the transfer substrate can be manufactured.

Meanwhile, in order to implement a display device having a large area, it is desirable to transfer semiconductor light emitting elements a minimum number of times from a transfer substrate to a wiring substrate having a large area. Therefore, a new transfer method capable of minimizing arrangement error and of reducing the number of transfer operations by increasing the size of a transfer substrate is required. Hereinafter, such a new transfer method will be described with reference to FIGS. 15 to 26.

Figure 15:
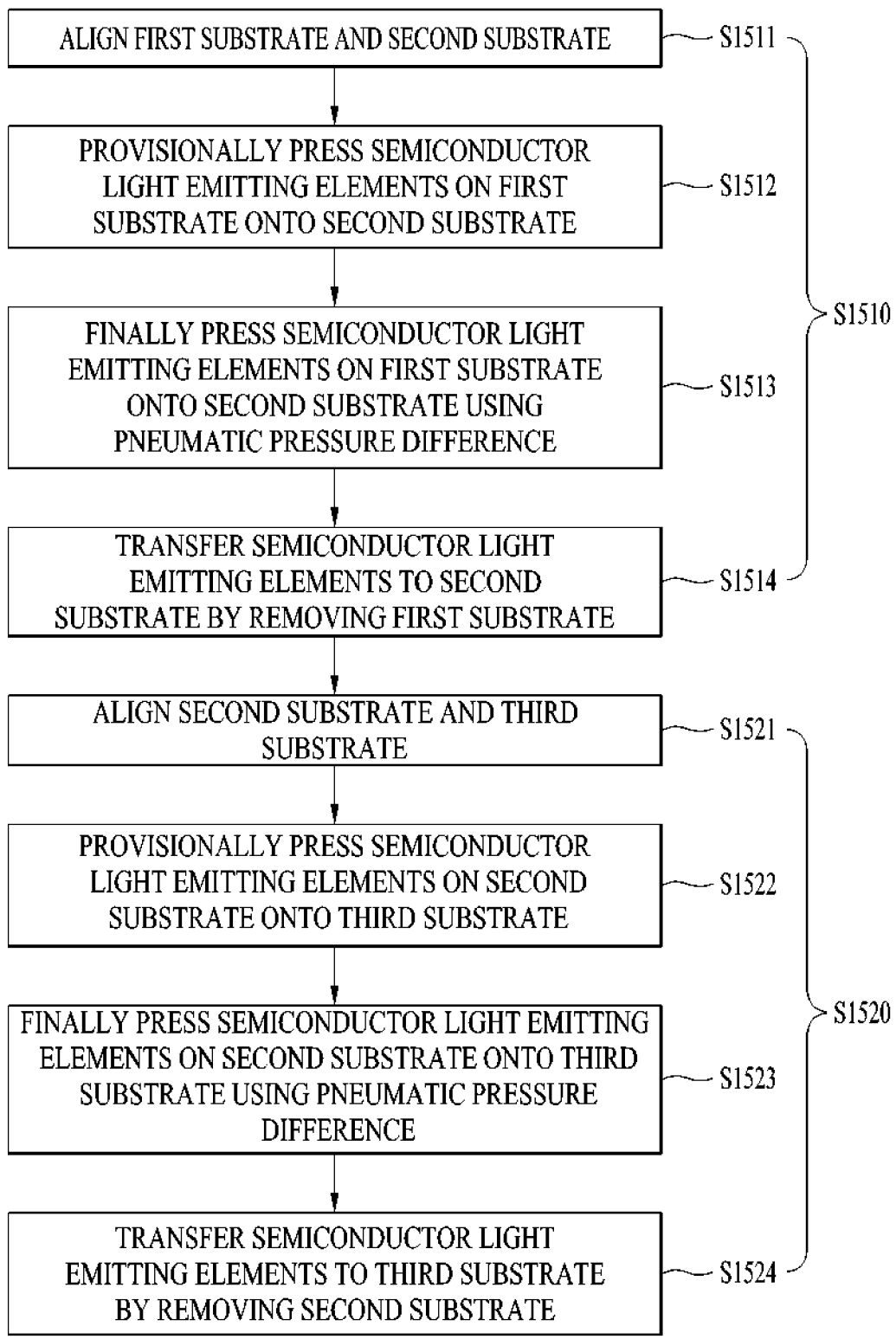
FIG. 15 is a flowchart showing a process of transferring semiconductor light emitting elements through a transfer method of the present disclosure.

FIG. 15 is a flowchart showing a process of transferring semiconductor light emitting elements through a transfer method of the present disclosure.

Compared to a conventional transfer method, the main feature of the transfer method of the present disclosure is that a step of performing final pressing using a pneumatic pressure difference is included. In the conventional transfer method, when semiconductor light emitting elements on a first substrate are transferred to a second substrate, mechanical pressure is applied to the substrates. However, according to the present disclosure, pressing is performed using pressure generated by a pneumatic pressure difference between the front surface and the rear surface of the second substrate. The pneumatic pressure difference may be generated by introducing the substrates into a chamber and performing vacuum pressing or high-pressure pressing.

The transfer process may be broadly divided into a primary transfer step S1510 for transfer from a first substrate to a second substrate and a secondary transfer step S1520 for transfer from the second substrate to a third substrate.

The first substrate may be a growth substrate on which semiconductor light emitting elements are formed or an assembly substrate to which semiconductor light emitting elements are assembled. The second substrate may be a transfer substrate, and may include an organic stamp layer, which is adhesive. The third substrate may be a wiring substrate for a display device.

The primary transfer step S1510 will be first described in detail. As shown in FIG. 15, a second substrate for transfer is aligned with a first substrate, on which semiconductor light emitting elements are provided, so as to face the first substrate (S1511). The first substrate may be made of a light-transmissive material, and accordingly, the second substrate may be aligned with the arrangement positions of the semiconductor light emitting elements on the first substrate using a camera.

Thereafter, the semiconductor light emitting elements on the first substrate are provisionally pressed onto the second substrate (S1512). In this case, the provisional pressing is a step of bringing the semiconductor light emitting elements into contact with the second substrate. In the provisional pressing state, little or no mechanical pressure may be applied to the components.

Thereafter, the semiconductor light emitting elements on the first substrate are finally pressed onto the second substrate using a pneumatic pressure difference (S1513). The pneumatic pressure difference is the difference between the pneumatic pressure at the front surface of the second substrate (transfer substrate) and the pneumatic pressure at the rear surface (rear surface) thereof. More specifically, the pneumatic pressure at the front surface of the second substrate, with which the semiconductor light emitting elements are brought into contact, may be lower than the pneumatic pressure at the rear surface thereof, and thus pressure may be generated toward the front surface thereof. As will be described later, the second substrate may include a flexible material capable of changing in shape according to pressure, and thus the semiconductor light emitting elements on the first substrate may be strongly pressed onto the second substrate by the generated pressure. Further, this pressing process differs from the pressing process shown in FIG. 14, in which arrangement error occurs. In the case shown in FIG. 14, arrangement error occurs because the positions to which the semiconductor light emitting elements are transferred are shifted in the lateral direction of the organic stamp layer by mechanical pressure. In contrast, as will be described later, deformation of the organic stamp layer of the present disclosure serves to strongly press-bond the semiconductor light emitting elements and the organic stamp layer to each other without causing a shift in the positions to which the semiconductor light emitting elements are transferred.

Meanwhile, as the method of generating the pneumatic pressure difference, at least one of a vacuum pressing method and a high-pressure pressing method may be selected.

Since the second substrate includes the organic stamp layer, which is adhesive, the process of transferring the semiconductor light emitting elements on the first substrate to the second substrate is completed by removing the first substrate after the final pressing step S1513 (S1514).

Similar to the above description, the secondary transfer step S1520 will be described in detail. As shown in FIG. 15, a third substrate is aligned with the second substrate, to which the semiconductor light emitting elements have been transferred, so as to face the second substrate (S1521). The third substrate may be made of a light-transmissive material, and accordingly, the third substrate may be aligned with the arrangement positions of the semiconductor light emitting elements on the second substrate using a camera.

Thereafter, the semiconductor light emitting elements on the second substrate are provisionally pressed onto the third substrate (S1522). In this case, the provisional pressing is a step of bringing the semiconductor light emitting elements into contact with the third substrate. In the provisional pressing state, little or no mechanical pressure may be applied to the components.

Thereafter, the semiconductor light emitting elements on the second substrate are finally pressed onto the third substrate using a pneumatic pressure difference (S1523). The pneumatic pressure difference is the difference between the pneumatic pressure at the front surface of the second substrate (transfer substrate) and the pneumatic pressure at the rear surface (rear surface) thereof. More specifically, the pneumatic pressure at the front surface of the second substrate, with which the semiconductor light emitting elements are brought into contact, may be lower than the pneumatic pressure at the rear surface thereof, and thus pressure may be generated toward the front surface thereof. The semiconductor light emitting elements on the second substrate may be strongly pressed onto the third substrate by the generated pressure. Further, the third substrate includes an adhesive layer, which is more adhesive than the organic stamp layer of the second substrate, and thus the process of transferring the semiconductor light emitting elements on the second substrate to the third substrate is completed by removing the second substrate after the final pressing step S1523 (S1524).

Figure 16:
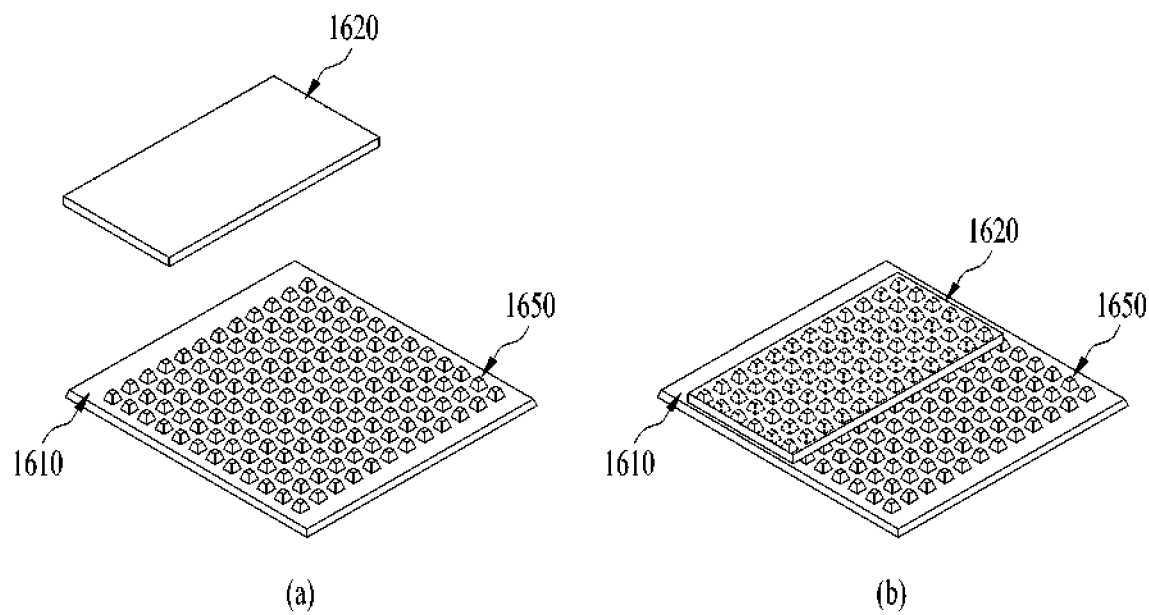
FIG. 16 illustrates diagrams showing a process of transferring semiconductor light emitting elements from a growth substrate (or an assembly substrate) to a transfer substrate according to the transfer method of the present disclosure.
Figure 16:
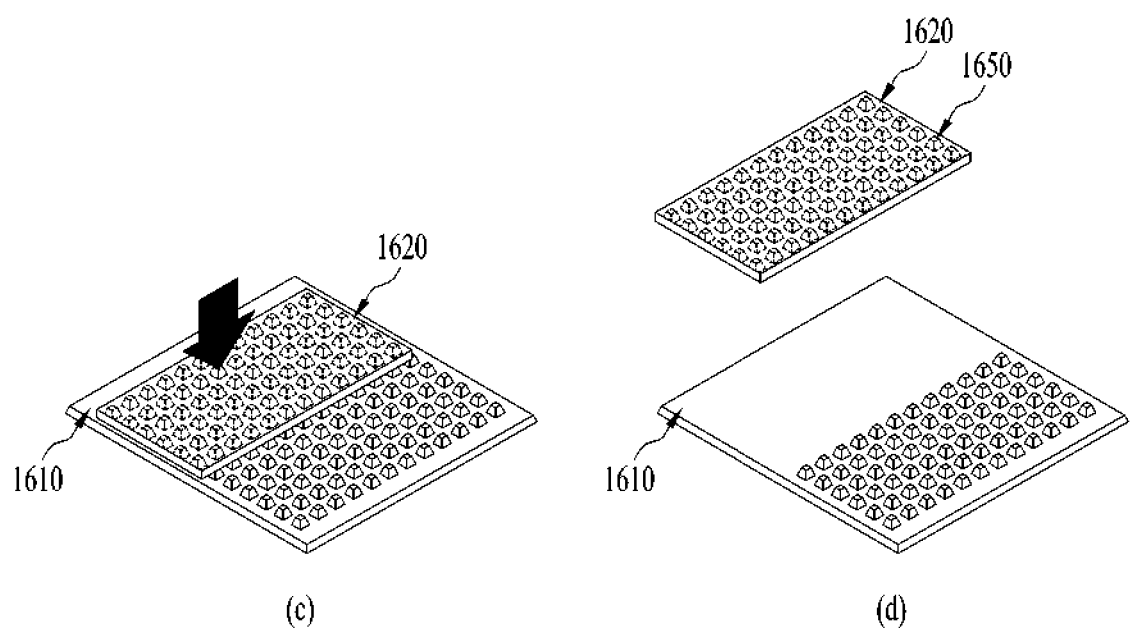

FIG. 16 illustrates diagrams showing a process of transferring semiconductor light emitting elements from a growth substrate (or an assembly substrate) to a transfer substrate according to the transfer method of the present disclosure.

As shown in FIG. 16(a), a first substrate 1610, provided with semiconductor light emitting elements 1650, and a second substrate 1620 for transfer are aligned so as to face each other. The second substrate includes an organic stamp layer, and is made of an organic material that is capable of being deformed by pressure.

Thereafter, as shown in FIG. 16(b), the semiconductor light emitting elements 1650 on the first substrate 1610 and the second substrate 1620 are provisionally pressed.

Thereafter, as shown in FIG. 16(c), the semiconductor light emitting elements 1650 on the first substrate 1610 and the second substrate 1620 are finally pressed. The final pressing is performed through vacuum pressing or high-pressure pressing, and the organic stamp layer of the second substrate and the semiconductor light emitting elements on the first substrate are strongly pressed.

Thereafter, as shown in FIG. 16(d), the semiconductor light emitting elements 1650 on the first substrate 1610, which are pressed onto the second substrate 1620, are transferred to the second substrate 1620.

Figure 17:
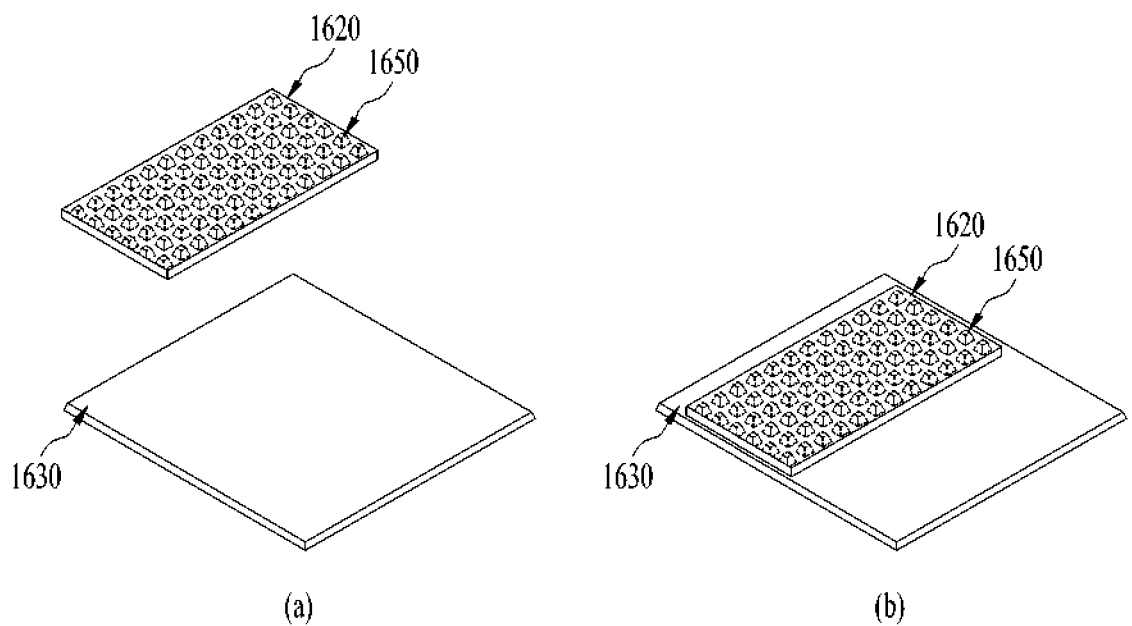
FIG. 17 illustrates diagrams showing a process of transferring the semiconductor light emitting elements from the transfer substrate to a wiring substrate according to the transfer method of the present disclosure.
Figure 17:
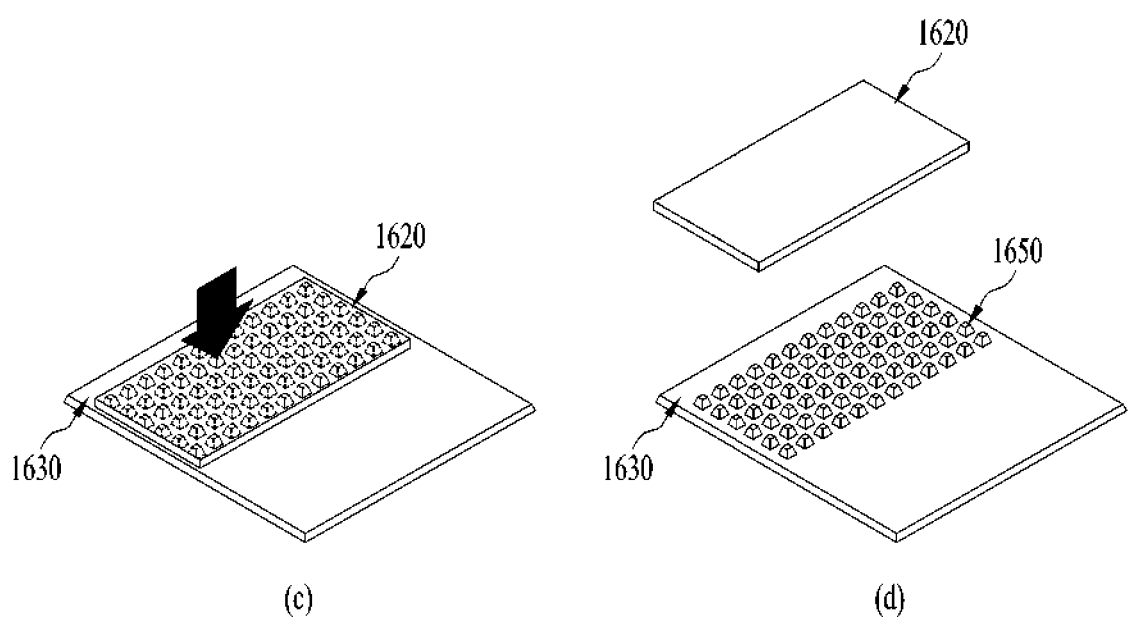

FIG. 17 illustrates diagrams showing a process of transferring the semiconductor light emitting elements from the transfer substrate to a wiring substrate according to the transfer method of the present disclosure.

As shown in FIG. 17(a), the second substrate 1620, to which the semiconductor light emitting elements 1650 have been transferred, and a third substrate 1630 for a display device are aligned so as to face each other. The third substrate may be made of a light-transmissive material, and thus the alignment position thereof may be determined using a camera.

Thereafter, as shown in FIG. 17(b), the semiconductor light emitting elements 1650 on the second substrate 1620 and the third substrate 1630 are provisionally pressed.

Thereafter, as shown in FIG. 17(c), the semiconductor light emitting elements 1650 on the second substrate 1620 and the third substrate 1630 are finally pressed. The final pressing is performed through vacuum pressing or high-pressure pressing, and the semiconductor light emitting elements 1650 on the second substrate 1620 and the third substrate are strongly pressed.

Thereafter, as shown in FIG. 17(d), the semiconductor light emitting elements 1650 on the second substrate 1620, which are pressed onto the third substrate 1630, are transferred to the third substrate 1620.

Figure 18:
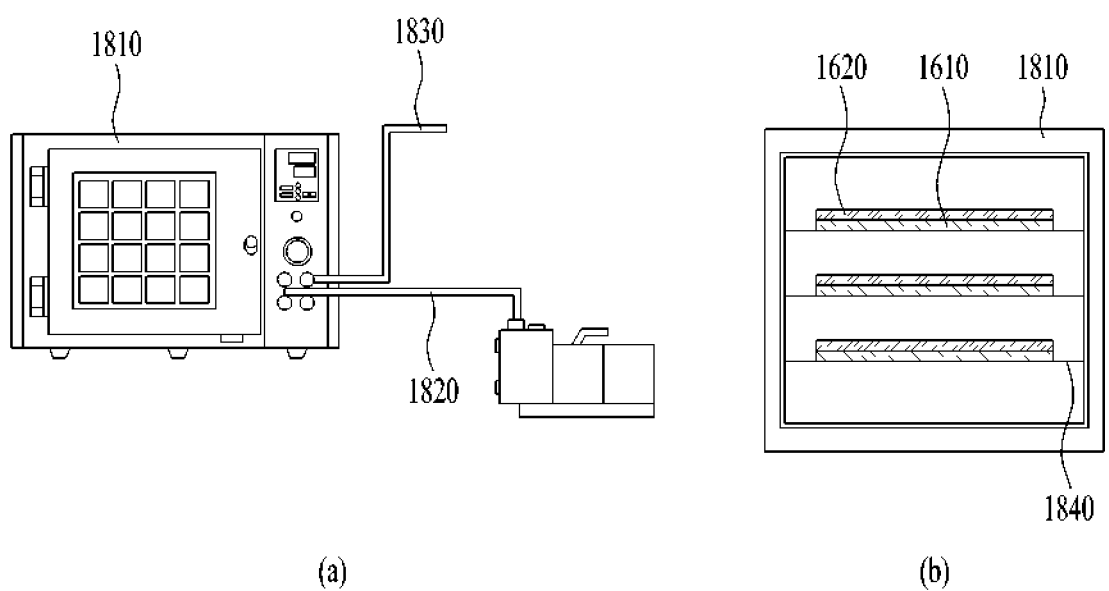
FIG. 18 illustrates diagrams showing a specific method of generating a pneumatic pressure difference according to the present disclosure.

FIG. 18 illustrates diagrams showing a specific method of generating a pneumatic pressure difference according to the present disclosure.

As described above, the major feature of the transfer method of the present disclosure is to transfer the semiconductor light emitting elements using pressure generated on a substrate by a pneumatic pressure difference, rather than using mechanical pressure. Therefore, as shown in FIG. 18(a), a chamber 1810 configured to generate a pneumatic pressure difference is required. The chamber 1810 may be a vacuum chamber for vacuum pressing or a high-pressure chamber for high-pressure pressing. Therefore, as shown in FIG. 18(a), the chamber 1810 may include a connection valve 1820 for injection of high-pressure gas or a connection valve 1830 for creating a vacuum.

Further, as shown in FIG. 18(b), the first substrate 1610 and the second substrate 1620, which have been provisionally pressed, or the second substrate and the third substrate, which have been provisionally pressed, may be disposed in the chamber 1810. Further, a plurality of provisionally pressed substrates may be disposed on trays 1840 disposed in the chamber 1810, at which time final pressing may be performed thereon, whereby a processing time may be shortened.

Figure 19:
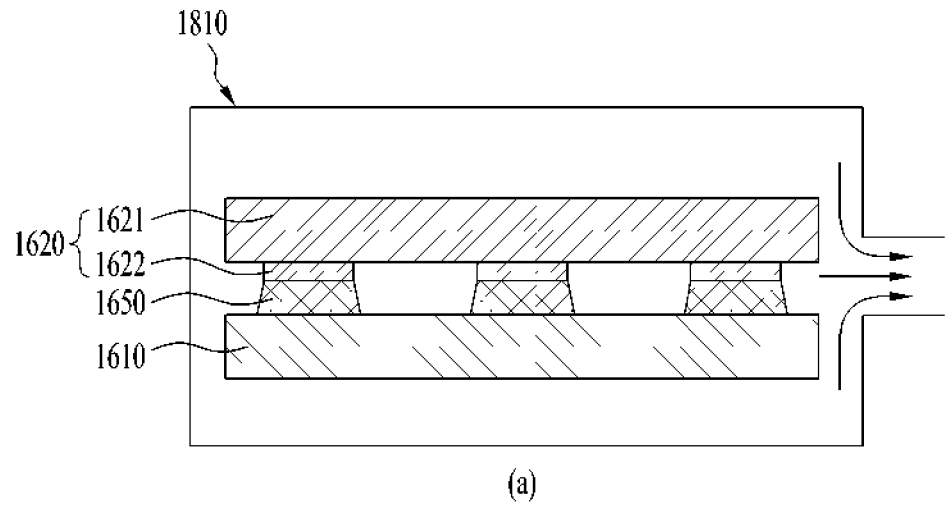
FIG. 19 illustrates diagrams showing a process of finally pressing the semiconductor light emitting elements onto the transfer substrate through a vacuum pressing method.
Figure 19:
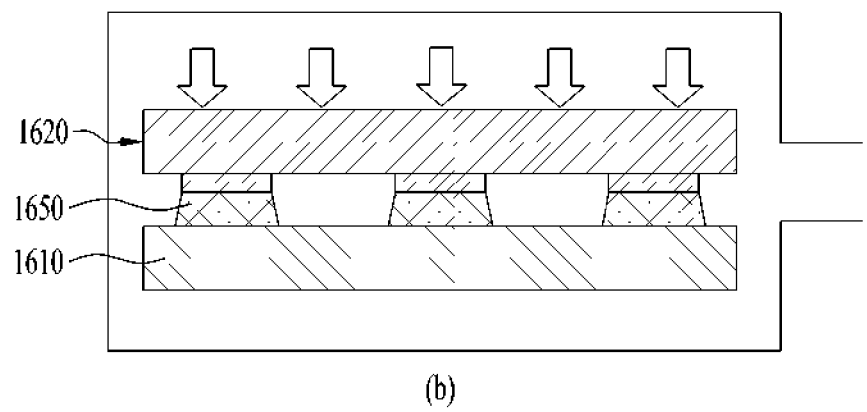
Figure 19:
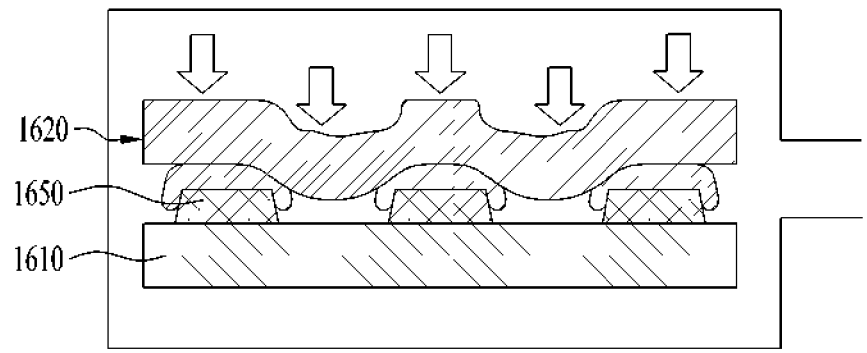

FIG. 19 illustrates diagrams showing a process of finally pressing the semiconductor light emitting elements onto the transfer substrate through a vacuum pressing method.

As shown in FIG. 19(a), the semiconductor light emitting elements 1650 on the first substrate 1610 are in the state of being in contact with and provisionally pressed onto the organic stamp layer 1622 of the second substrate (or the transfer substrate 1620). Further, the second substrate 1620 may include a base layer 1621 for supporting the organic stamp layer 1622, and the organic stamp layer 1622 and the base layer 1621 may be made of the same material as each other, or may be made of different materials having different rigidities. When air is discharged to the outside as indicated by the arrows in FIG. 19(a) in the state in which the first substrate 1610 and the second substrate 1620, which have been provisionally pressed, are disposed in the chamber

1810, the pressure in the chamber 1810 may be changed to atmospheric pressure or lower.

Since the pressure in the chamber 1810 is changed to that of a vacuum, having pressure lower than or equal to atmospheric pressure, as shown in FIG. 19(*b*), pressure may be generated in a direction from the rear surface of the second substrate 1620 toward the front surface thereof, which is in contact with the semiconductor light emitting elements 1650 on the first substrate 1610. A detailed description thereof will be given later with reference to the simulation results shown in FIGS. 25 and 26.

As the pressure generated on the second substrate 1620 increases, the shape of the second substrate 1620 may change, and as shown in FIG. 19(*c*), the second substrate 1620 may be pressed while surrounding the semiconductor light emitting elements 1650 on the first substrate 1610. That is, pressure may be generated on a substrate by a change in pneumatic pressure without separate mechanical pressure, and the substrate may be sufficiently pressed onto another substrate merely by the generated pressure. Further, as shown in FIG. 19, in the case of vacuum pressing, pressure may be uniformly applied in a direction from the rear surface of the second substrate 1620 toward the front surface thereof, and the pressing may be realized in a relatively short time (within a few seconds), thereby minimizing the occurrence of arrangement error during transfer. Furthermore, pressure may be applied to the entire surface of the second substrate 1620 irrespective of the flatness or size of the second substrate 1620, thus removing a limitation on the maximum possible size of the transfer substrate. Accordingly, the number of transfer operations may be reduced.

Figure 20:
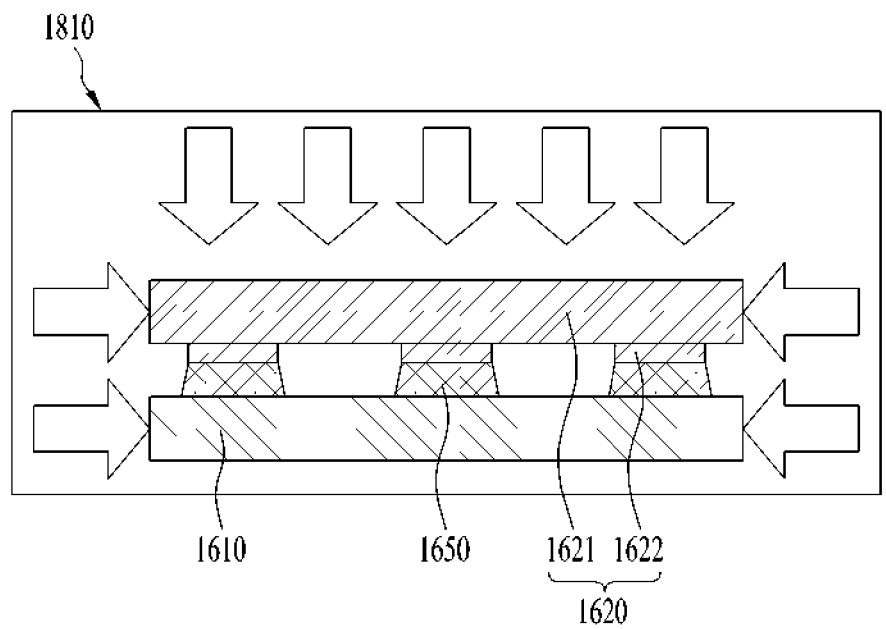
FIG. 20 illustrates diagrams showing a process of finally pressing the semiconductor light emitting elements onto the transfer substrate through a high-pressure pressing method.
Figure 20:
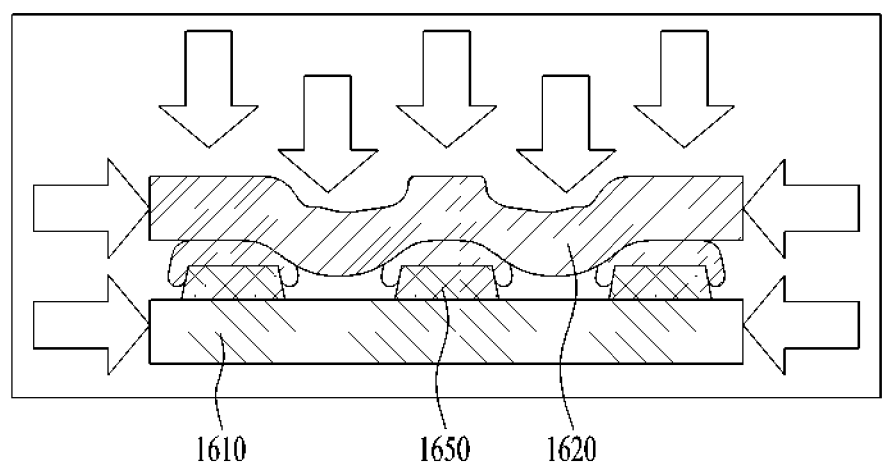

FIG. 20 illustrates diagrams showing a process of finally pressing the semiconductor light emitting elements onto the transfer substrate through a high-pressure pressing method.

As shown in FIG. 20(*a*), the semiconductor light emitting elements 1650 on the first substrate 1610 are in the state of being in contact with and provisionally pressed onto the organic stamp layer 1622 of the second substrate (or the transfer substrate 1620). Further, the second substrate 1620 may include a base layer 1621 for supporting the organic stamp layer 1622, and the organic stamp layer 1622 and the base layer 1621 may be made of the same material as each other, or may be made of different materials having different rigidities. When high-pressure gas is injected into the chamber 1810 as indicated by the arrows in FIG. 20(*a*) in the state in which the first substrate 1610 and the second substrate 1620, which have been provisionally pressed, are disposed in the chamber 1810, the pneumatic pressure in the chamber 1810 may be changed to atmospheric pressure or higher. Specifically, the high-pressure gas may have pressure exceeding atmospheric pressure, and may be sprayed in all directions toward the semiconductor light emitting elements 1650 and the second substrate 1620, which have been provisionally pressed.

Further, since the pressure in the chamber 1810 is changed to high pressure equal to or higher than atmospheric pressure, as similarly shown in FIG. 19(*a*), pressure may be generated in a direction from the rear surface of the second substrate 1620 toward the front surface thereof, which is in contact with the semiconductor light emitting elements 1650 on the first substrate 1610. In addition, the same pressure may also be applied to two opposite side surfaces of each of the semiconductor light emitting elements 1650.

As the pressure applied in the direction from the rear surface of the second substrate 1620 toward the front surface thereof increases, the shape of the second substrate 1620 may change, and as shown in FIG. 20(*b*), the second substrate 1620 may be pressed while surrounding the semiconductor light emitting elements 1650 on the first substrate 1610. That is, pressure may be generated on a substrate by high-pressure gas, and the substrate may be sufficiently pressed onto another substrate merely by the generated pressure. Experimentally, it was found that the final pressing process was successfully achieved when the pressure of the high-pressure gas was 5 times or more than atmospheric pressure.

Further, as shown in FIG. 20, in the case of high-pressure pressing, pressure may be uniformly applied in a direction from the rear surface of the second substrate 1620 toward the front surface thereof, and the pressing may be realized in a relatively short time (within a few seconds), thereby minimizing the occurrence of arrangement error during transfer. In particular, high-pressure gas is also sprayed to two opposite side surfaces of each of the semiconductor light emitting elements 1650, and thus it may be possible to prevent the positions of the semiconductor light emitting elements 1650 from being shifted in the lateral direction, thereby minimizing the occurrence of arrangement error during transfer.

Furthermore, pressure may be applied to the entire surface of the second substrate 1620 irrespective of the size of the second substrate 1620, thus removing a limitation on the maximum possible size of the transfer substrate. Accordingly, the number of transfer operations may be reduced.

Figure 21:
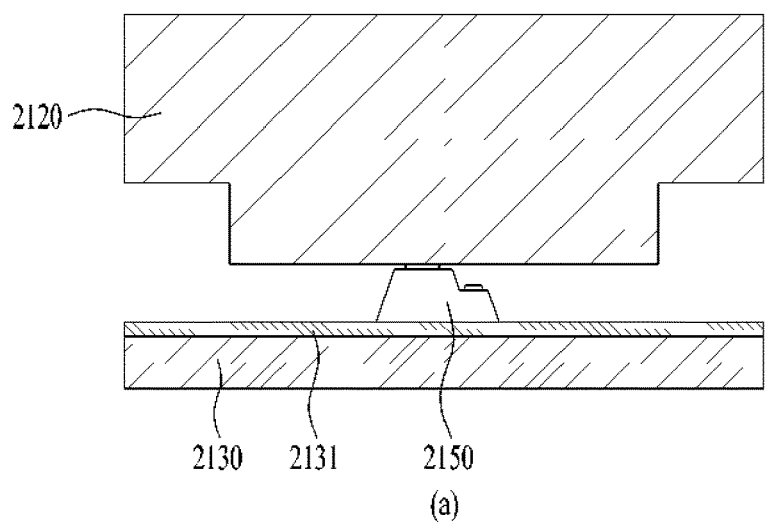
FIG. 21 illustrates cross-sectional diagrams showing a process in which an indentation is formed in an adhesive layer of a wiring substrate when a semiconductor light emitting element is transferred to the wiring substrate through the transfer method of the present disclosure.
Figure 21:
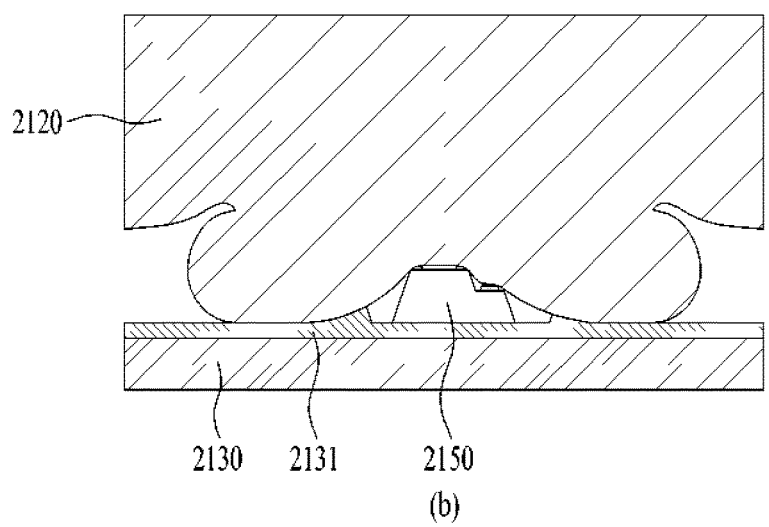
Figure 21:
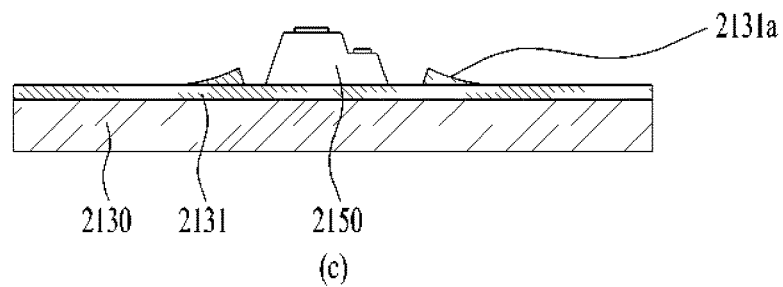

FIG. 21 illustrates cross-sectional diagrams showing a process in which an indentation is formed in an adhesive layer of a wiring substrate when a semiconductor light emitting element is transferred to the wiring substrate through the transfer method of the present disclosure.

As shown in FIG. 21(*a*), a semiconductor light emitting element 2150 is provisionally pressed between a second substrate 2120 and a third substrate 2130. The second substrate 2120 may be a transfer substrate provided with the semiconductor light emitting element 2150 transferred and located thereon, and the third substrate 2130 may be a wiring substrate provided with a transistor for driving an active matrix. In addition, an adhesive layer 2131 may be located on the third substrate 2130, and the adhesive layer 2131 may be more adhesive than the organic stamp layer of the second substrate 2120.

As shown in FIG. 21(*b*), when the final pressing process is performed on the second substrate 2120 and the third substrate 2130, which have been provisionally pressed, through vacuum pressing or high-pressure pressing, the shape of the second substrate 2120 may change. Specifically, the second substrate 2120 includes an organic stamp layer, and the organic stamp layer is made of a flexible material that is deformed by the pressure applied to the second substrate 2120. Accordingly, in the final pressing process, a portion of the organic stamp layer may be brought into contact with the adhesive layer 2131 of the third substrate 2130, as shown in FIG. 21(*b*). In addition, in the contact region between the adhesive layer 2131 and the organic stamp layer, an indentation may be formed in the transfer surface of the third substrate 2130, to which the semiconductor light emitting element 2150 is transferred.

For example, as shown in FIG. 21(*c*), the indentation may include an elevated portion 2131*a*, which is formed on a periphery of the region of the adhesive layer 2131 that comes into contact with the organic stamp layer of the second substrate 2120.

The height of the elevated portion 2131*a* may be formed in proportion to the intensity of the pressure applied to the adhesive layer 2131 by the organic stamp layer of the second substrate 2120. That is, in order to adjust the height of the elevated portion 2131a, the vacuum strength may be adjusted in the case of vacuum pressing, or the pressure of the gas that is sprayed may be adjusted in the case of high-pressure pressing.

Figure 22:
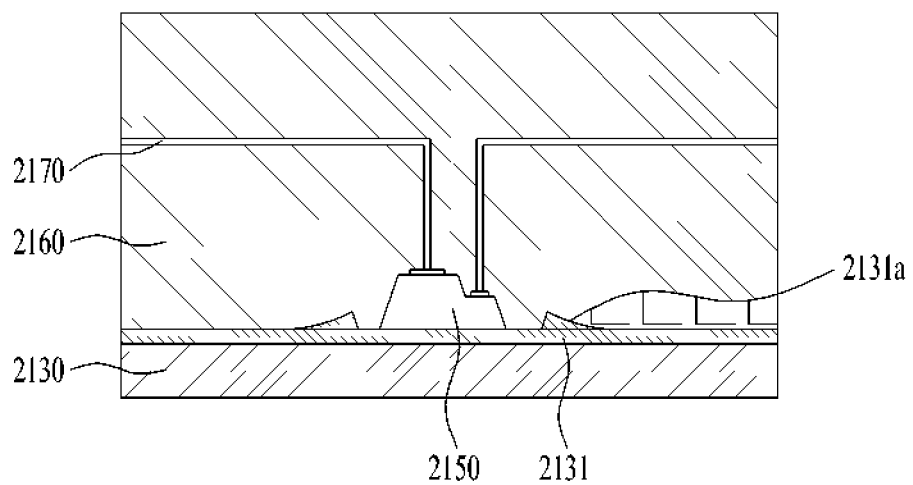
FIG. 22 is a diagram showing an embodiment in which an insulating layer and a wiring electrode are formed on the semiconductor light emitting element transferred to the wiring substrate.

FIG. 22 is a diagram showing an embodiment in which an insulating layer and a wiring electrode are formed on the semiconductor light emitting element transferred to the wiring substrate.

As shown in FIG. 22, the semiconductor light emitting element 2150 may be transferred to the adhesive layer 2131 of the third substrate (or the wiring substrate 2130), and an insulating layer 2160 may be formed on the semiconductor light emitting element 2150 and the adhesive layer 2131. In addition, a wiring electrode 2170, which is electrically connected to the semiconductor light emitting element 2150, may be formed so as to be connected to the transistor formed on the third substrate 2130. In addition, since the transfer process is performed through vacuum pressing or high-pressure pressing, the display device of the present disclosure may include an elevated portion 2131a, which is formed on the adhesive layer 2131 in a region peripheral to the contact surface of the semiconductor light emitting element 2150 so as to correspond to the shape of the contact surface, as shown in FIG. 22.

Figure 23:
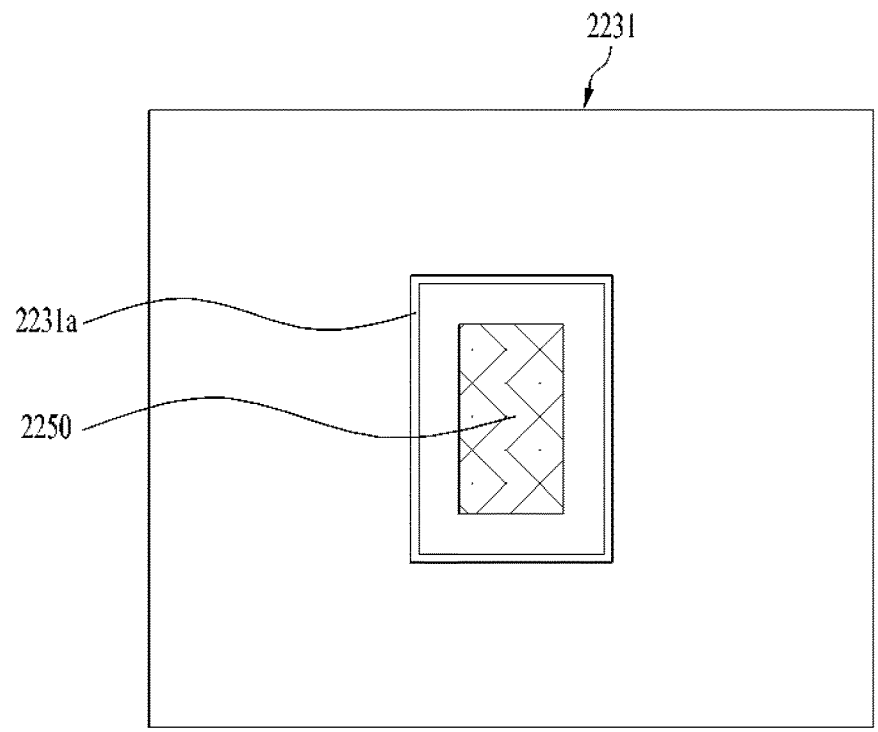
FIG. 23 illustrates diagrams showing various shapes of the indentation formed in the adhesive layer of the wiring substrate.
Figure 23:
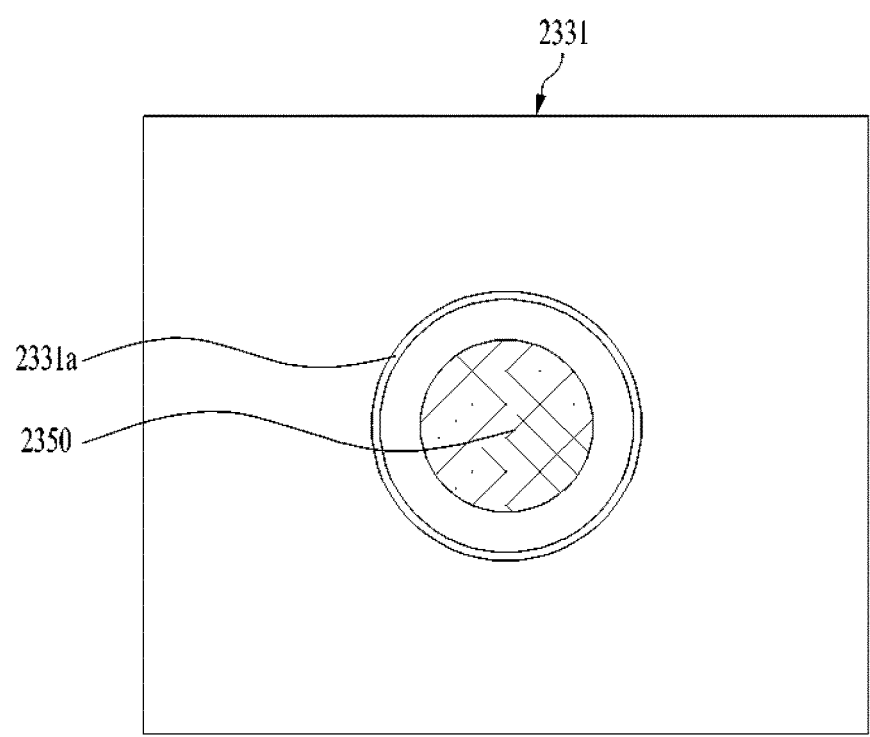

FIG. 23 illustrates diagrams showing various shapes of the indentation formed in the adhesive layer of the wiring substrate.

As shown in FIG. 23(*a*), the indentation formed in the adhesive layer 2231 of the third substrate (or the wiring substrate) includes an elevated portion 2231a, and the elevated portion 2231a is formed so as to correspond to the shape of the contact surface of the semiconductor light emitting element 2250. Further, the elevated portion 2231a is continuously formed on the adhesive layer 2231 in the shape of a closed curve. Further, the semiconductor light emitting element 2250 is located inside the closed curve.

Accordingly, as shown in FIG. 23(*a*), when the contact surface of the semiconductor light emitting element 2250 has a rectangular shape, the elevated portion 2231a is also continuously formed in the shape of a rectangular closed curve while being spaced a designated interval apart from the semiconductor light emitting element 2250.

Similarly, as shown in FIG. 23(*b*), when the contact surface of the semiconductor light emitting element 2350 has a circular shape, the elevated portion 2331a on the adhesive layer 2331 is also continuously formed in the shape of a circular closed curve while being spaced a designated interval apart from the semiconductor light emitting element 2350.

Figure 24:
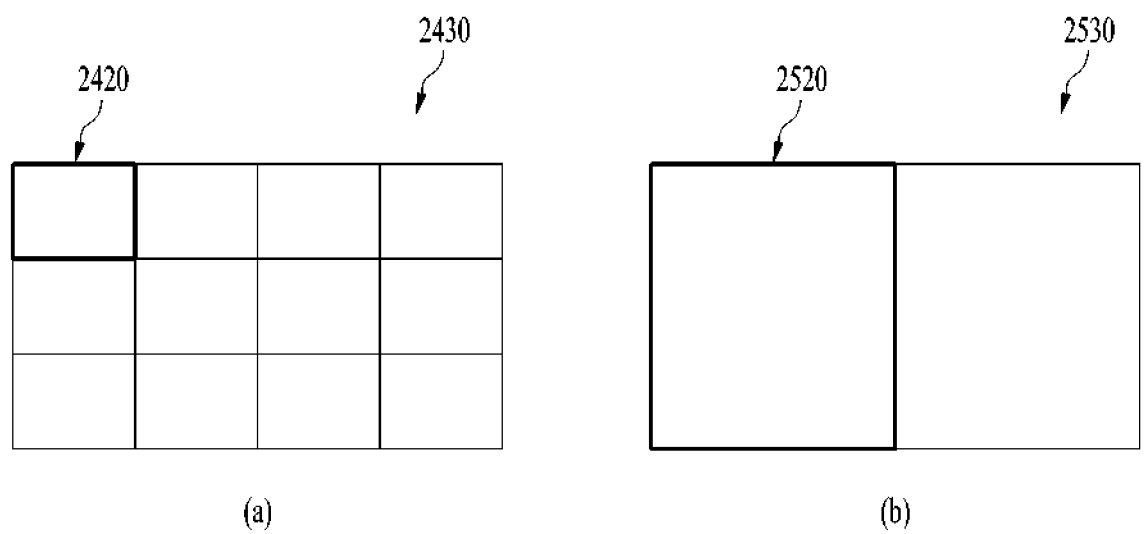
FIG. 24 illustrates diagrams showing that the number of transfer operations in the transfer method of the present disclosure is reduced compared to a conventional transfer method.

FIG. 24 illustrates diagrams showing that the number of transfer operations in the transfer method of the present disclosure is reduced compared to the conventional transfer method.

As described above, in the conventional transfer method, although a transfer substrate having an organic stamp layer is used, arrangement error occurs depending on the flatness of the transfer substrate when mechanical pressure is applied to the transfer substrate, and thus there is a limitation on the maximum possible size of the transfer substrate. For example, when a transfer process is performed on a wiring substrate 2430 having a designated size through the conventional transfer method, as shown in FIG. 24(*a*), the transfer process may be performed twelve times in order to complete transfer to the wiring substrate 2430 because the transfer substrate 2420 has a limited size.

In contrast, when the transfer method of the present disclosure, which uses vacuum pressing or high-pressure pressing, is performed, as described above, arrangement error is not as strongly correlated with the size of the transfer substrate, thus making it possible to increase the size of the transfer substrate. For example, as shown in FIG. 24(*b*), the size of a transfer substrate 2520 may be formed to be about half the size of a wiring substrate 2350. In this case, in order to transfer semiconductor light emitting elements to a wiring substrate 2530 having the size shown in FIG. 24(*a*), the transfer process may only need to be performed two times. That is, the transfer method of the present disclosure may shorten the time required for transfer of semiconductor light emitting elements, may confer advantages in the manufacture of a display device having a large area, and may reduce manufacturing costs.

Figure 25:
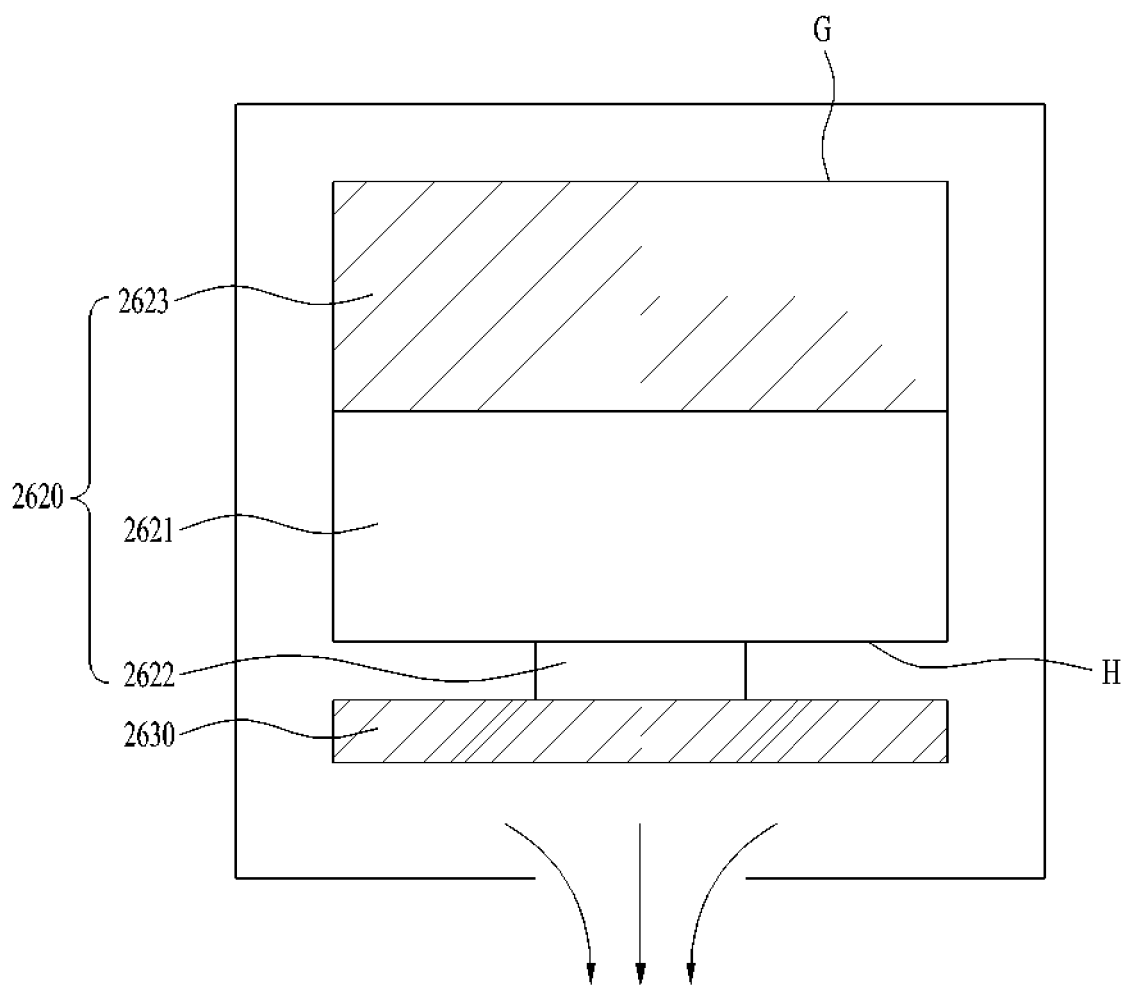
FIG. 25 illustrates a simulation model for observing pressure applied to a substrate in the vacuum pressing method.

FIG. 25 illustrates a simulation model for observing the pressure applied to a substrate in the vacuum pressing method.

Air in a chamber may be discharged downwards to the outside as indicated by the arrows in FIG. 25 in order to create a vacuum state in the chamber, and accordingly, the pneumatic pressure in the chamber may be lowered from 760 Torr, which is atmospheric pressure, to 0.01 Torr.

In this case, an upper substrate 2620 and a lower substrate 2630 are in a provisionally pressed state in which no separate mechanical pressure is applied thereto. The upper substrate 2620 includes an organic stamp layer and a base layer 2623, and the organic stamp layer includes a protrusion 2622 and a support portion 2621. In addition, the simulation model is configured such that the base layer 2623 is made of polycarbonate and the organic stamp layer is made of a PDMS material. In an actual process, the upper substrate 2620 corresponds to a transfer substrate, and the lower substrate 2630 corresponds to a wiring substrate.

Further, simulation was performed using the simulation model shown in FIG. 25 on the assumption that the height of the protrusion 2622 was 10 µm, the width of the protrusion 2622 was 120 µm, the height of the support portion 2621 was 400 µm, and the width of the support portion 2621 was 500 µm.

In addition, in the simulation, pressure was applied to the substrates to be observed, and the pressure sensed in one region G of the base layer 2623 of the upper substrate 2620 and the pressure sensed in one region H of the support portion 2622 were calculated.

Figure 26:
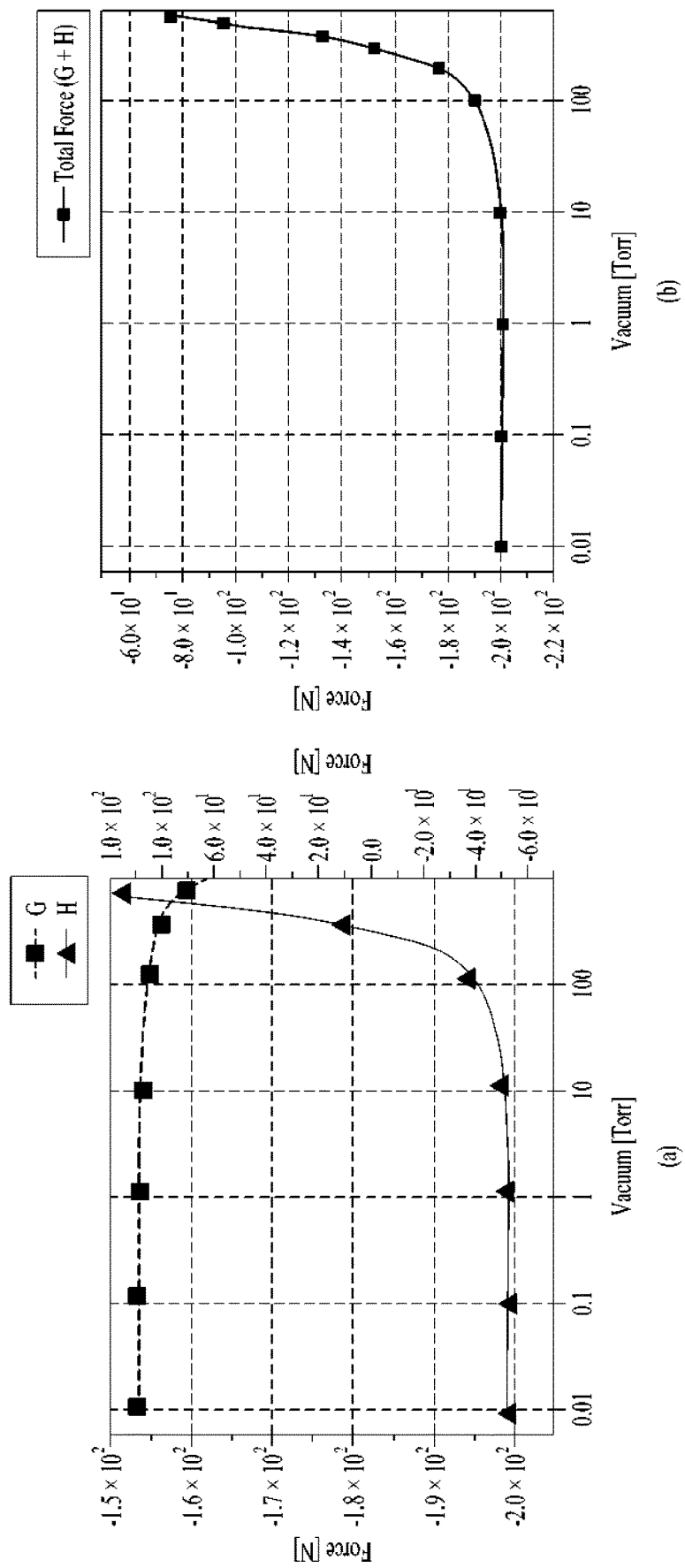
FIG. 26 illustrates a result of simulating pressure applied to the transfer substrate in the model shown in FIG. 25, which varies depending on the vacuum strength.

FIG. 26 illustrates a result of simulating the pressure applied to the transfer substrate in the model shown in FIG. 25, which varies depending on the vacuum strength.

As shown in FIG. 26(*a*), as the pneumatic pressure decreases (as the vacuum strength increases), the pressures that are sensed in the region H and the region G shown in FIG. 25 change.

The pressure may be expressed as Force(N). As shown in FIG. 26(*a*), as the vacuum strength increases, the pressure that is sensed in the region G changes little, and the pressure that is sensed in the region H changes from about $1.0*10^2$ N to about $-6.0*10^2$ N. When the pressure sensed in the region H changes from (+) to (−), this means that the direction of the pressure changes. That is, when the pneumatic pressure is around atmospheric pressure, the protrusion is in contact with the lower substrate, and thus pressure may be generated in the upward direction by the repulsive force resulting from the contact. However, as the vacuum strength increases, the pneumatic pressure at the rear surface of the upper substrate becomes higher than the pneumatic pressure at the front surface thereof, and thus pressure may be generated in a direction from the rear surface toward the front surface. That is, the pressure applied in a direction from the region G toward the region H becomes greater than the repulsive force. Thus, as the vacuum strength increases, the pressure sensed in the region H may be expressed as (−).

FIG. 26(b) is a graph showing the sum of the pressure sensed in the region G on the rear surface of the upper substrate and the pressure sensed in the region H on the front surface of the upper substrate. In the atmospheric pressure state, pressure is applied to the region G in a direction toward the front surface of the upper substrate (force acts downwards based on FIG. 25), and pressure is applied to the region H in a direction toward the rear surface of the upper substrate (force acts upwards based on FIG. 25). However, the pressures cancel each other, and thus the intensity of the force that is applied to the upper substrate is very small. Therefore, although the upper substrate is made of a flexible material, the shape of the upper substrate does not change easily.

However, as shown in FIG. 26(b), as the vacuum strength increases, the sum of the pressure that is applied to the region G and the pressure that is applied to the region H is expressed as the (−) direction. That is, as the vacuum strength increases, the pressure that is applied to the upper substrate 2620 shown in FIG. 25 increases in a direction toward the lower substrate 2630.

Therefore, assuming that the upper substrate is the transfer substrate of the present disclosure, which is capable of changing in shape in response to application of pressure thereto, the upper substrate may be deformed sufficiently to come into contact with the lower substrate as the vacuum strength increases. This process has been described above with reference to FIG. 21.

Meanwhile, the sum of the pressures that are applied to the region G and the region H (or the pressure that is applied to the upper substrate) according to the vacuum strength may be saturated at a vacuum strength of about 10 Torr, as shown in FIG. 26(b).

Here, the saturation vacuum strength of 10 Torr is a result obtained using the simulation model shown in FIG. 25, and the saturation vacuum strength may vary in an actual process depending on the structure of the transfer substrate and the structure of the semiconductor light emitting element.

Therefore, in an actual vacuum pressing, the vacuum strength at which the pressure that is applied to the transfer substrate is saturated is checked, and then a final pressing process is performed at the corresponding vacuum strength, whereby the processing time may be optimized. Meanwhile, it is experimentally observed that desired pressing characteristics are obtained even at a vacuum strength of about 600 Torr, which is less than atmospheric pressure. Therefore, in some cases, it may be possible to shorten the processing time by performing the final pressing process even before the vacuum strength reaches the saturation vacuum strength.

The above description is merely illustrative of the technical idea of the present disclosure. Those of ordinary skill in the art to which the present disclosure pertains will be able to make various modifications and variations without departing from the essential characteristics of the present disclosure.

Therefore, embodiments disclosed in the present disclosure are not intended to limit the technical idea of the present disclosure, but to describe, and the scope of the technical idea of the present disclosure is not limited by such embodiments.

The scope of protection of the present disclosure should be interpreted by the claims below, and all technical ideas within the scope equivalent thereto should be construed as being included in the scope of the present disclosure.

What is claimed is:

1. A method of manufacturing a display device, the method comprising:
   aligning a second substrate for transfer so as to face a first substrate provided thereon with a semiconductor light emitting element;
   provisionally pressing the semiconductor light emitting element on the first substrate onto the second substrate;
   finally pressing the semiconductor light emitting element on the first substrate onto the second substrate using pressure applied to the second substrate, the pressure being generated according to a change in pneumatic pressure in a chamber; and
   transferring the semiconductor light emitting element on the first substrate to the second substrate by removing the first substrate.

2. The method of claim 1, further comprising:
   aligning a third substrate so as to face the second substrate;
   provisionally pressing the semiconductor light emitting element on the second substrate onto the third substrate;
   finally pressing the semiconductor light emitting element on the second substrate onto the third substrate using pressure applied to the second substrate, the pressure being generated according to a change in the pneumatic pressure in the chamber; and
   transferring the semiconductor light emitting element on the second substrate to the third substrate by removing the second substrate.

3. The method of claim 1, wherein the finally pressing comprises performing at least one of vacuum pressing or high-pressure pressing based on the pneumatic pressure in the chamber.

4. The method of claim 1, wherein the first substrate is a growth substrate configured to allow the semiconductor light emitting element to be formed thereon or an assembly substrate configured to allow the semiconductor light emitting element to be assembled thereto.

5. The method of claim 2, wherein the third substrate is a wiring substrate provided with a transistor to perform an active matrix drive of the display device.

6. The method of claim 2, wherein the second substrate comprises an organic stamp layer, the organic stamp layer being an adhesive.

7. The method of claim 6, wherein the third substrate comprises an adhesive layer formed on a surface of the third substrate to which the semiconductor light emitting element is transferred.

8. The method of claim 7, wherein the organic stamp layer has a first adhesive force lower than a second adhesive force of the adhesive layer.

9. The method of claim 7, wherein the organic stamp layer is made of a flexible material, the flexible material being deformable according to pressure applied to the organic stamp layer when the pressure is applied to the second substrate.

10. The method of claim 9, wherein, in the finally pressing the semiconductor light emitting element onto the third substrate, an indentation is formed in the adhesive layer so as to correspond to a transfer surface of the semiconductor light emitting element transferred to the third substrate.

11. The method of claim 10, wherein the indentation is formed in a contact region of the adhesive layer, the contact region of the adhesive layer coming into contact with a portion of the organic stamp layer due to deformation of the organic stamp layer.

12. The method of claim 11, wherein the indentation comprises an elevated portion formed on a periphery of the contact region.

13. The method of claim 12, wherein the elevated portion has a height formed in proportion to an intensity of pressure applied to the organic stamp layer.

14. The method of claim 3, wherein, in the finally pressing, the vacuum pressing is performed to make pneumatic pressure at a front surface of the second substrate be lower than pneumatic pressure at a rear surface of the second substrate, the front surface of the second substrate being provided with the semiconductor light emitting element transferred thereto.

15. The method of claim 3, wherein the high-pressure pressing is performed to spray a gas having pressure exceeding atmospheric pressure in all directions toward the provisionally pressed semiconductor light emitting element and the second substrate.

16. A display device comprising:
a substrate;
an adhesive layer located on the substrate, the adhesive layer comprising an elevated portion;
a semiconductor light emitting element located on the adhesive layer;
an insulating layer located on the semiconductor light emitting element and the adhesive layer; and
a wiring electrode electrically connected to the semiconductor light emitting element,
wherein the elevated portion of the adhesive layer is formed so as to correspond to a shape of a contact surface of the semiconductor light emitting element, the contact surface being in contact with the adhesive layer, and is spaced a predetermined interval apart from the semiconductor light emitting element.

17. The display device of claim 16, wherein the elevated portion is continuously formed on the adhesive layer in a shape of a closed curve.

18. The display device of claim 17, wherein the semiconductor light emitting element is located inside the closed curve.

19. A display device comprising:
a substrate;
a semiconductor light emitting element on the substrate;
an insulating layer located on the semiconductor light emitting element;
a wiring electrode electrically connected to the semiconductor light emitting element; and
an adhesive layer disposed between the substrate and the semiconductor light emitting element, the adhesive layer including a planar portion and an elevated portion that is raised higher than the planar portion,
wherein the semiconductor light emitting element is located on the planar portion, and the elevated portion encircles the semiconductor light emitting element.

20. A method of manufacturing the display device according to claim 19, the method comprising:
pressing the semiconductor light emitting element on a first substrate onto a second substrate using pressure applied to the second substrate, the pressure being generated according to a change in pneumatic pressure in a chamber;
transferring the semiconductor light emitting element on the first substrate to the second substrate by removing the first substrate;
pressing the semiconductor light emitting element on the second substrate onto the substrate using pressure applied to the second substrate, the pressure being generated according to a change in the pneumatic pressure in the chamber; and
transferring the semiconductor light emitting element on the second substrate to the substrate by removing the second substrate,
wherein the substrate comprises an adhesive layer formed on a surface of the substrate to which the semiconductor light emitting element is transferred.

* * * * *